(12) United States Patent
Iijima et al.

(10) Patent No.: US 10,057,995 B2
(45) Date of Patent: Aug. 21, 2018

(54) ELECTRONIC DEVICE

(71) Applicant: FUJITSU LIMITED, Kawasaki-shi, Kanagawa (JP)

(72) Inventors: Shinya Iijima, Hadano (JP); Yoshikatsu Ishizuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 185 days.

(21) Appl. No.: 14/806,895

(22) Filed: Jul. 23, 2015

(65) Prior Publication Data

US 2016/0088737 A1    Mar. 24, 2016

(30) Foreign Application Priority Data

Sep. 24, 2014  (JP) ................. 2014-193238

(51) Int. Cl.
| | |
|---|---|
| H05K 1/18 | (2006.01) |
| H05K 3/34 | (2006.01) |
| H01L 23/00 | (2006.01) |
| H05K 7/00 | (2006.01) |
| H01L 23/28 | (2006.01) |
| H05K 3/28 | (2006.01) |
| H01L 21/56 | (2006.01) |

(52) U.S. Cl.
CPC ........... *H05K 3/3436* (2013.01); *H01L 24/19* (2013.01); *H01L 21/568* (2013.01); *H01L 2224/04105* (2013.01); *H01L 2224/12105* (2013.01); *H01L 2224/16227* (2013.01); *H01L 2224/32225* (2013.01); *H01L 2224/73204* (2013.01); *H01L 2224/73267* (2013.01); *H01L 2225/1035* (2013.01); *H01L 2225/1041* (2013.01); *H01L 2225/1058* (2013.01); *H01L 2924/19105* (2013.01); *H05K 1/181* (2013.01); *H05K 3/284* (2013.01); *H05K 2201/0367* (2013.01); *H05K 2201/10984* (2013.01); *Y02P 70/613* (2015.11)

(58) Field of Classification Search
CPC ......... H05K 3/284; H05K 2201/10977; H05K 2203/0591; H05K 2203/0759; H05K 2203/1377
USPC ................ 361/748, 760, 761, 763, 765–783; 257/787–793
See application file for complete search history.

(56) References Cited

U.S. PATENT DOCUMENTS

| | | | |
|---|---|---|---|
| 8,350,306 B2 * | 1/2013 | Sato ........................ | H01G 4/228 257/295 |
| 2006/0043568 A1 * | 3/2006 | Abe ..................... | H01L 21/4857 257/698 |
| 2009/0008765 A1 * | 1/2009 | Yamano .................. | H01L 24/83 257/690 |

(Continued)

FOREIGN PATENT DOCUMENTS

| | | |
|---|---|---|
| JP | H04-150095 | 5/1992 |
| JP | 2004-6576 A1 | 1/2004 |

(Continued)

*Primary Examiner* — Binh Tran

(74) *Attorney, Agent, or Firm* — Kratz, Quintos & Hanson, LLP

(57) ABSTRACT

An electronic device includes a resin layer, a conductive layer buried in the resin layer, an electronic part buried in the resin layer, and a wiring layer arranged on the resin layer, the wiring layer including wiring and an opening, the wiring being connected electrically to the conductive layer and the electronic part, the opening communicating with the conductive layer.

8 Claims, 21 Drawing Sheets

(56) References Cited

U.S. PATENT DOCUMENTS

2009/0052150 A1    2/2009  Kobayashi

FOREIGN PATENT DOCUMENTS

| JP | 2009-54686 A1 | 3/2009 |
| JP | 2011-258847 A1 | 12/2011 |

* cited by examiner

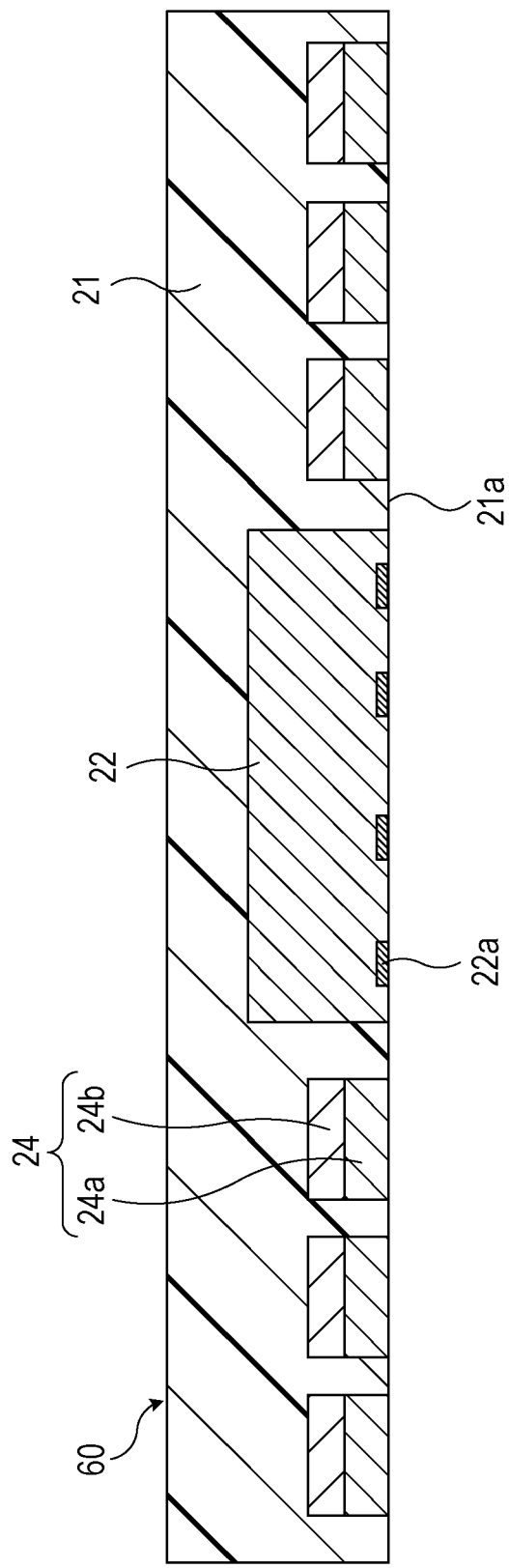

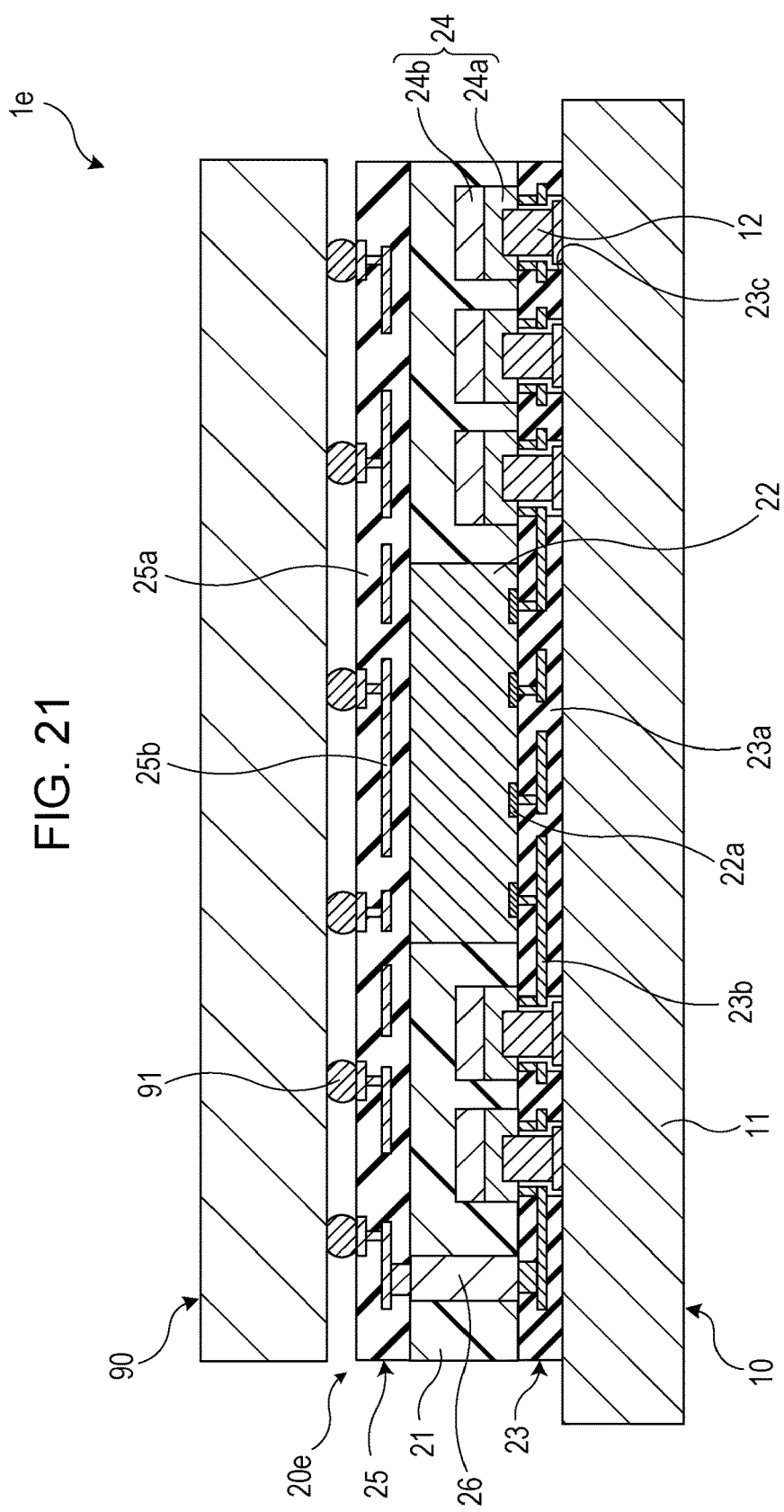

ELECTRONIC DEVICE

CROSS-REFERENCE TO RELATED APPLICATION

This application is based upon and claims the benefit of priority of the prior Japanese Patent Application No. 2014-193238, filed on Sep. 24, 2014, the entire contents of which are incorporated herein by reference.

FIELD

The embodiments discussed herein are related to an electronic device, and a method of manufacturing an electronic device.

BACKGROUND

As one of electronic part packages (electronic devices) including an electronic part, such as a semiconductor device, or the like, a wafer level package (WLP) (also referred to as a wafer level-chip size package (WL-CSP), or a wafer-chip size package (W-CSP)) is known. The WLP makes it possible for terminals of an electronic part to be relocated (fan-in) in its part area. Also, with an increase in the number of terminals of an electronic part, a WLP that is capable of relocating (fan-out) terminals outside its part area is being developed in view of the difficulty of reallocating terminals within its part area.

Regarding manufacture of such an electronic part package, a technique using a method of disposing an electronic part on a supporting body, sealing the electronic part with a resin layer to produce a pseudo wafer, and separating the pseudo wafer from the supporting body is known. A wiring layer is provided on the surface of the pseudo wafer separated from the supporting body, and then the pseudo wafer is divided into individual electronic part packages.

For example, an electronic part package is provided with bumps on its wiring layer, and is mounted on a substrate, such as a motherboard, or the like using the bumps.

A related-art technique is disclosed in Japanese Laid-open Patent Publication No. 2011-258847.

SUMMARY

According to an aspect of the invention, an electronic device includes a resin layer, a conductive layer buried in the resin layer, an electronic part buried in the resin layer, and a wiring layer arranged on the resin layer, the wiring layer including wiring and an opening, the wiring being connected electrically to the conductive layer and the electronic part, the opening communicating with the conductive layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is a diagram illustrating an example of a method of forming an electronic part package according to the first embodiment (Part 6);

FIG. 21 is a diagram illustrating an example of a package module according to a fifth embodiment.

DESCRIPTION OF EMBODIMENTS

In a package module (electronic device) mounted on a substrate using solder bumps of the electronic part package, the mounting height and the footprint of the electronic part package on the substrate becomes large in accordance with the size of a bump, and a pitch demanded in order to suppress a short circuit between adjacent bumps. Accordingly, it is sometimes difficult to miniaturize and to improve packaging density of the package module.

Figure 1:
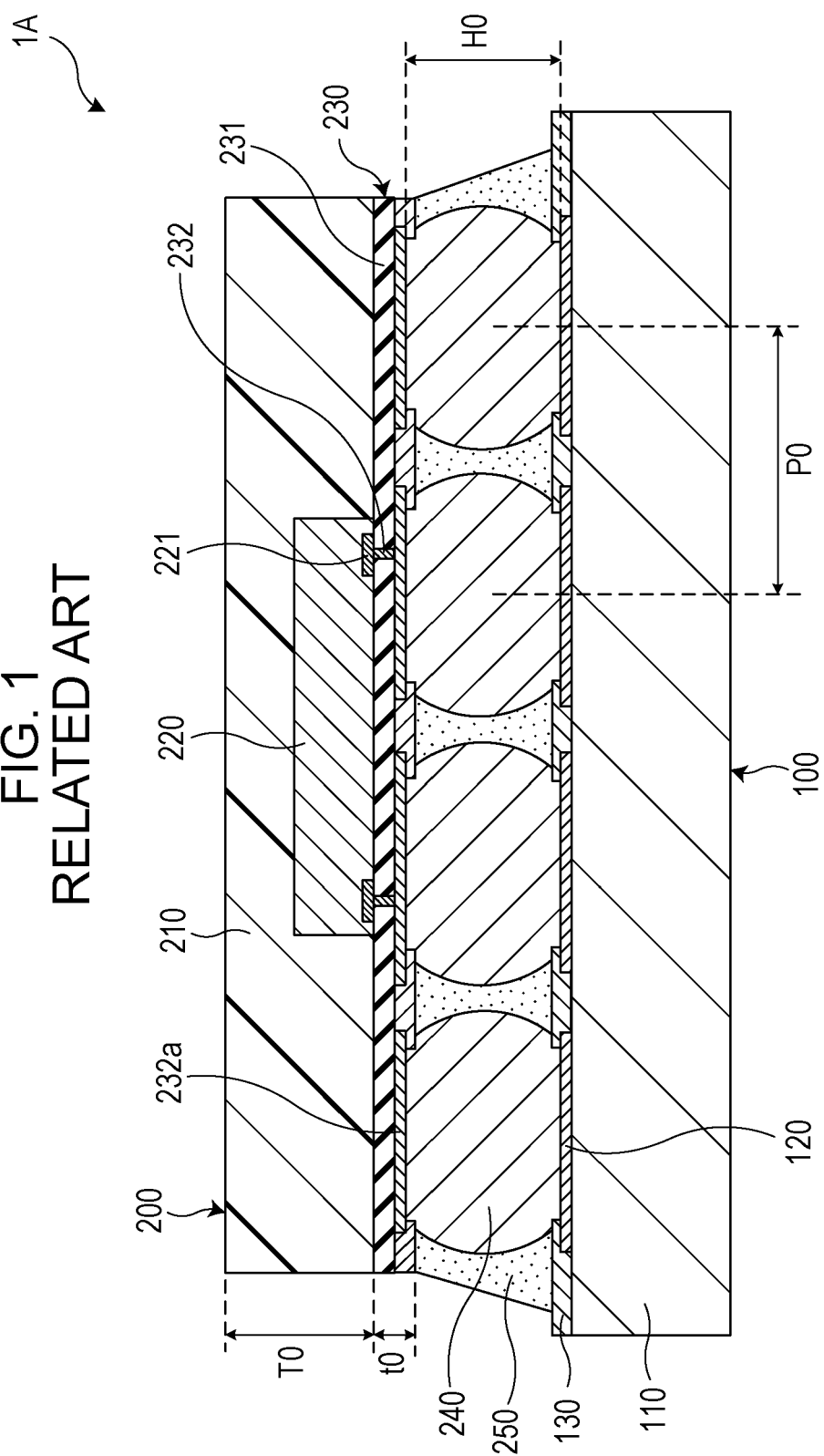
FIG. 1 is a diagram illustrating an example of a package module.

First, a description will be given of a form of a package module in which an electronic part package is mounted on a substrate. FIG. 1 is a diagram illustrating an example of a package module. FIG. 1 schematically illustrates a sectional view of a main part of an example of the package module.

A package module 1A (electronic device) illustrated in FIG. 1 includes a circuit substrate 100, such as a motherboard, or the like, and an electronic part package 200

(electronic device) that is mounted using bumps 240 mounted on the circuit substrate 100.

The circuit substrate 100 includes a substrate 110 internally provided with wiring, vias, and the like (not illustrated in FIG. 1), and terminals 120 disposed on the substrate 110. A protection film 130 is disposed on the substrate 110 such that at least a part of the terminals 120 are exposed.

The electronic part package 200 includes a resin layer 210, an electronic part 220, such as a semiconductor device, and the like buried in the resin layer 210, and a wiring layer 230 disposed on the resin layer 210 and the electronic part 220.

The electronic part package 200 is formed as follows, for example. First, the electronic part 220 is disposed on a supporting body with a disposition surface (front face) of its terminals 221 facing the supporting body. Next, the electronic part 220 disposed on the supporting body is sealed with the resin layer 210 such that a face (rear face) of the opposite side to the disposition surface of the terminals 221, and the side face thereof are buried to be reconstructed as a wafer state. Here, an object reconstructed in a wafer state in this manner is referred to as a pseudo wafer. The thickness T0 of the resin layer 210 of the pseudo wafer is about 400 μm, for example.

After the pseudo wafer is formed, the supporting body is separated, and a wiring layer 230 (re-wiring layer) including an insulating part 231 and a wiring 232 (re-wiring) is formed on the face of the pseudo wafer separated from the supporting body. The thickness t0 of the wiring layer 230 is about 20 μm, for example. The wiring 232 of the outermost layer of the wiring layer 230 is used as terminals 232a of the electronic part package 200. A wiring 232 (terminals 232a) of the wiring layer 230 is formed such that the terminals 221 of the electronic part 220 is relocated (fan-out) outside of the disposition area of the electronic part 220, for example.

After the wiring layer 230 is formed, the bumps 240 are formed on the terminals 232a using solder, or the like, for example. The pseudo wafer on which the bumps 240 were formed is separated by dicing, and thus the individual electronic part package 200 as illustrated in FIG. 1 is obtained. The electronic part package 200 is also referred to as a pseudo system on a chip (SoC), or the like.

The electronic part package 200 obtained in this manner is mounted on the circuit substrate 100 using the bumps 240. For example, the bumps 240 are brought into contact with the terminals 120 of the circuit substrate 100, and are subjected to reflowing at predetermined temperature to connect the bump 240 and the terminals 120. Thereby, the electronic part 220 of the electronic part package 200 and the circuit substrate 100 are electrically connected through the terminals 221, the wiring 232 (terminals 232a), the bumps 240, and the terminals 120.

The gaps between the circuit substrate 100 and the electronic part package 200 are provided with underfill resin 250 in order to strengthen the connection as illustrated in FIG. 1, for example. In the package module 1A as illustrated in FIG. 1, the mounting height, and the footprint of the electronic part package 200 become a certain size or more in accordance with the diameter H0 of the used bumps 240, and the pitch P0 demanded for suppressing a short circuit between adjacent bumps 240 when the bumps 240 are used. For example, the diameter of the bumps 240 becomes 200 μm or more, and the pitch P0 becomes 400 μm or more. In the package module 1A, the mounting height of the electronic part package 200 on the circuit substrate 100 becomes large in accordance with the diameter H0 of the used bumps 240. Also, the pitch of the terminals 232a of the electronic part package 200 (and the terminals 120 of the circuit substrate 100), and the planar size of the electronic part package 200 become large in accordance with the pitch P0 of the bumps 240, and thus the footprint of the electronic part package 200 on the circuit substrate 100 become large.

As described above, in the form of the package module 1A in which the electronic part package 200 and the circuit substrate 100 are connected using the bumps 240, there is a limit of narrowing the pitches of the terminals 232a and the terminals 120, and of reducing the footprint of the electronic part package 200 on the circuit substrate 100. Accordingly, it is sometimes difficult to slimming (lowering the height of), reducing the planar size, or improving the packaging density of the package module 1A.

In view of the above points, here, the configurations as exemplified in the following embodiments are employed for an electronic part package and a package module.

Figure 2:
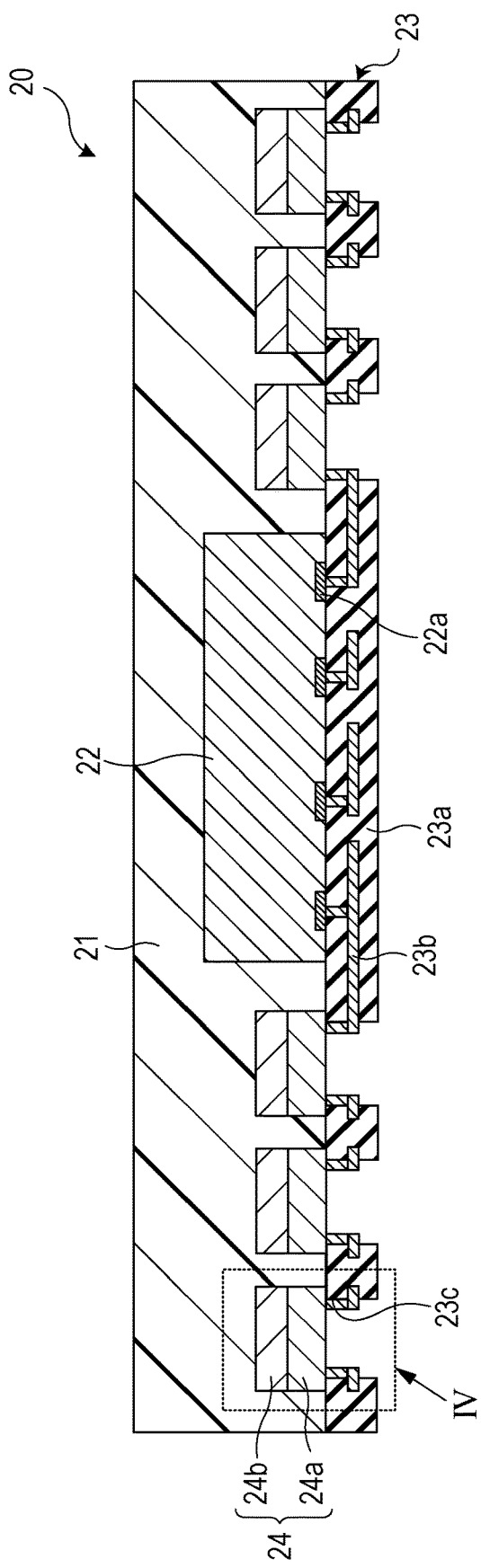
FIG. 2 is a diagram illustrating an example of an electronic part package according to a first embodiment (Part 1)
Figure 3:
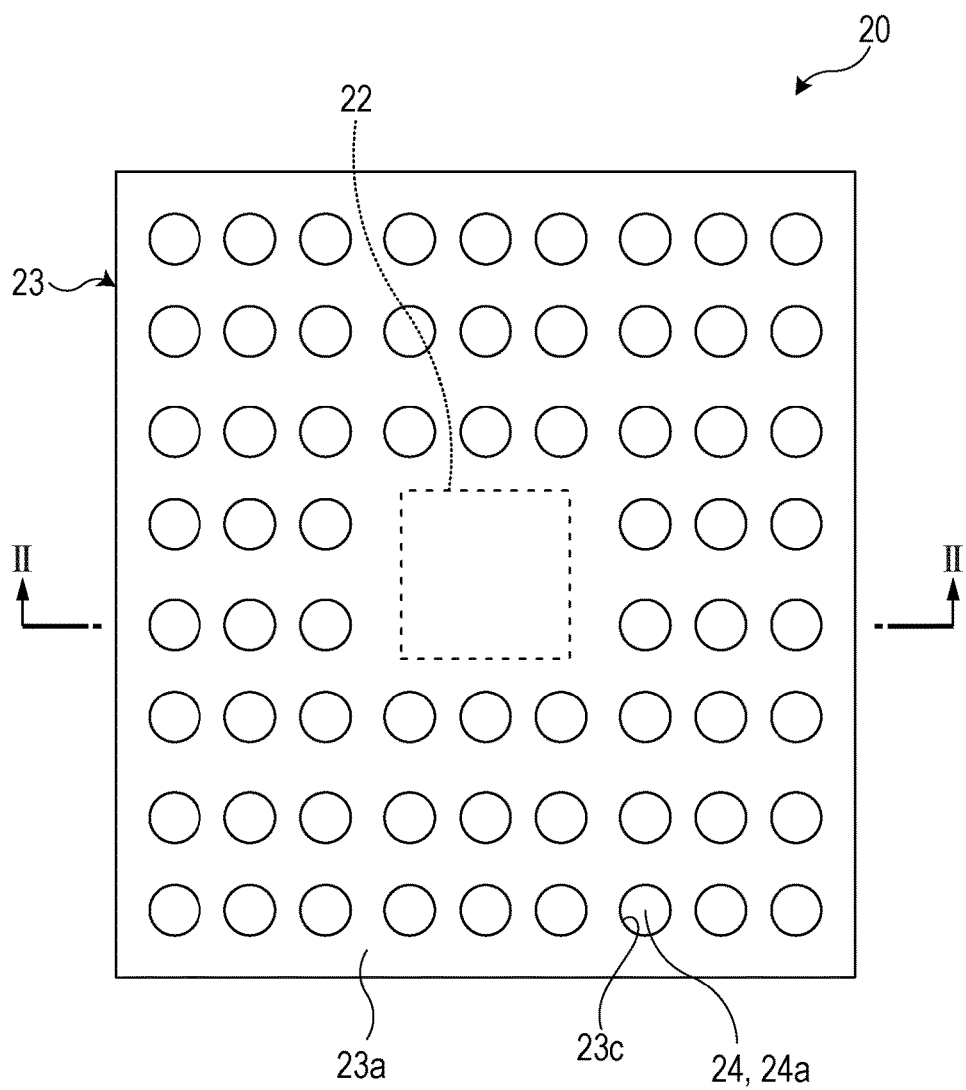
FIG. 3 is a diagram illustrating an example of an electronic part package according to the first embodiment (Part 2)
Figure 4:
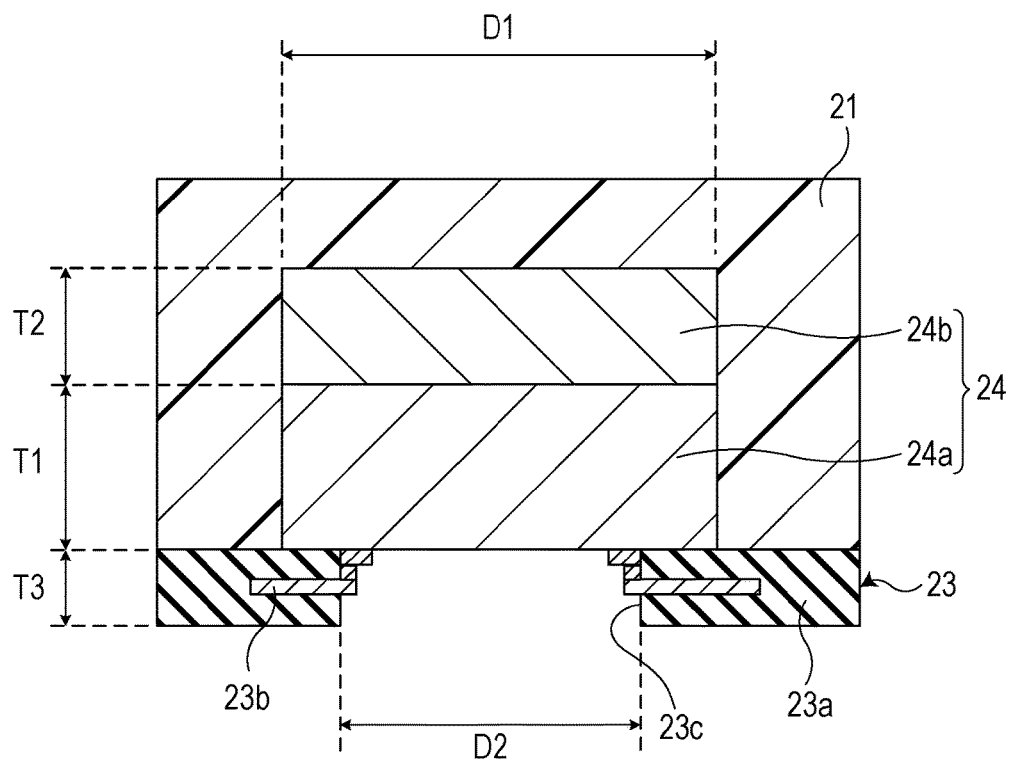
FIG. 4 is a diagram illustrating an example of an electronic part package according to the first embodiment (Part 3)

First, a description will be given of a first embodiment. FIG. 2 to FIG. 4 are diagrams illustrating an example of an electronic part package according to the first embodiment. FIG. 2 is a schematic sectional view of a main part of an example of the electronic part package according to the first embodiment, FIG. 3 is a schematic plan view of the main part of the example of the electronic part package according to the first embodiment, and FIG. 4 is a partially enlarged view of the example of the electronic part package according to the first embodiment. In this regard, FIG. 2 is a schematic sectional view taken along line II-II in FIG. 3, and FIG. 4 is an enlarged view of an IV portion in FIG. 2.

The electronic part package 20 includes a resin layer 21, an electronic part 22 and a conductive layer 24, which are buried in the resin layer 21, and a wiring layer 23 disposed on the resin layer 21. For the resin layer 21, it is possible to use various non-conductive resin materials that are used for sealing a semiconductor device. For the resin layer 21, epoxy resin is used, for example. For the resin layer 21, a non-conductive filler, for example, alumina, silica, aluminum hydroxide, or aluminum nitride may be included, or a filler including at least one kind of these materials may be included.

The thickness of the resin layer 21 depends on the size of the electronic part 22, or the like to be buried as described later, but is about 400 μm to 600 μm, for example. It is possible to use various electronic parts for the electronic part 22. A semiconductor device (semiconductor chip) is used for the electronic part 22, for example. It is possible to use a bare chip of a large scale integration (LSI) or the like using a semiconductor (compound semiconductor) material, such as silicon (Si), gallium arsenide (GaAs), gallium nitride (GaN), or the like for the semiconductor device, for example. In this regard, here, one electronic part 22 that is buried in the resin layer 21 is illustrated as an example.

The conductive layer 24 includes a first conductive part 24a, and a second conductive part 24b disposed on the first conductive part 24a.

A metallic material having a lower melting point than that of the second conductive part 24b is used for the first conductive part 24a. For the first conductive part 24a, it is possible to use tin (Sn), an SnAg-based compound including Sn and silver (Ag), an SnBi-based compound including Sn and bismuth (Bi), an SnPb-based compound including Sn and lead (Pb), indium (In), and an In-compound including In, for example.

For the second conductive part 24b, metallic material that becomes wet when the first conductive part 24a melts is used. For the second conductive part 24b, copper (Cu), gold (Au), an Ni/Au-laminated body produced by laminating nickel (Ni) and Au (Au is the first conductive part 24a side), a Cu/Ni/Au-laminated body produced by laminating Cu, Ni and Au (Au is the first conductive part 24a side), for example.

The diameter D1 (FIG. 4) of the conductive layer 24 is 100 μm, for example. The thickness T1 (FIG. 4) of the first conductive part 24a of the conductive layer 24 is 50 μm, for example, and the thickness T2 (FIG. 4) of the second conductive part 24b is 30 μm, for example.

In this regard, a plurality of conductive layers 24 buried in the resin layer 21 are illustrated here as an example. The plurality of conductive layers 24 are disposed so as to be arranged vertically and horizontally in a matrix state in a plan view in the resin layer 21 as illustrated in FIG. 3, for example. The pitch of adjacent conductive layers 24 is set to, for example 100 μm in the same manner as a pitch P1 of the projecting terminal 12 of a circuit substrate 10 described later.

The electronic part 22 and the conductive layer 24 as described above are buried in the resin layer 21 as illustrated in FIG. 2 such that terminals 22a of the electronic part 22 and the first conductive part 24a of the conductive layer 24 are exposed. Then, a wiring layer 23 (re-wiring layer) is disposed on the resin layer 21, and the electronic part 22 and the conductive layer 24 that are exposed from the resin layer 21.

The wiring layer 23 includes an insulating part 23a, and a wiring 23b (re-wiring) disposed in the insulating part 23a as illustrated in FIG. 2. For the insulating part 23a, it is possible to use various insulating materials, for example resin material, such as epoxy, polybenzoxazole, polyimide, or the like. For the wiring 23b, it is possible to use various conductive materials, for example a metallic material, such as Cu, or the like. The wiring 23b is electrically connected to the first conductive part 24a of the conductive layer 24 in the resin layer 21, and the terminals 22a of the electronic part 22. As illustrated in FIG. 2 and FIG. 3, the wiring layer 23 further includes an opening 23c communicating with the first conductive part 24a of the conductive layer 24 buried in the resin layer 21.

The thickness T3 (FIG. 4) of the wiring layer 23 is 20 μm, for example. The diameter D2 (FIG. 4) of the opening 23c of the wiring layer 23 is 70 μm, for example. A description will be given later of a method of forming the electronic part package 20.

Figure 5:
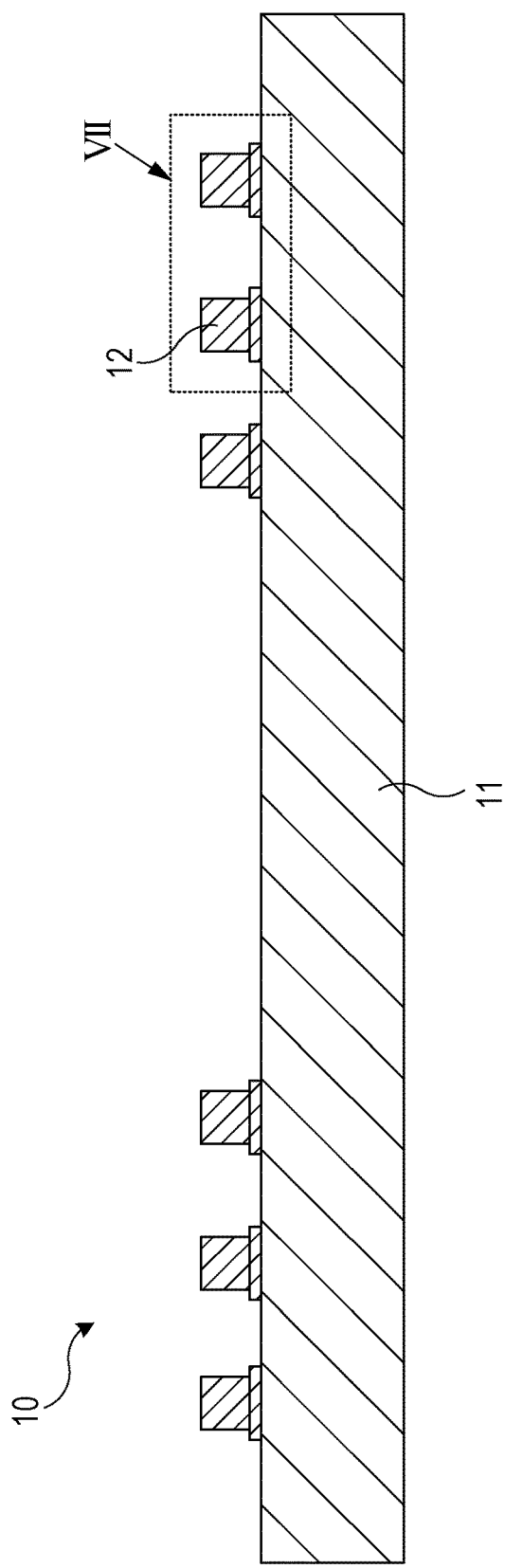
FIG. 5 is a diagram illustrating an example of a circuit substrate according to the first embodiment (Part 1)
Figure 6:
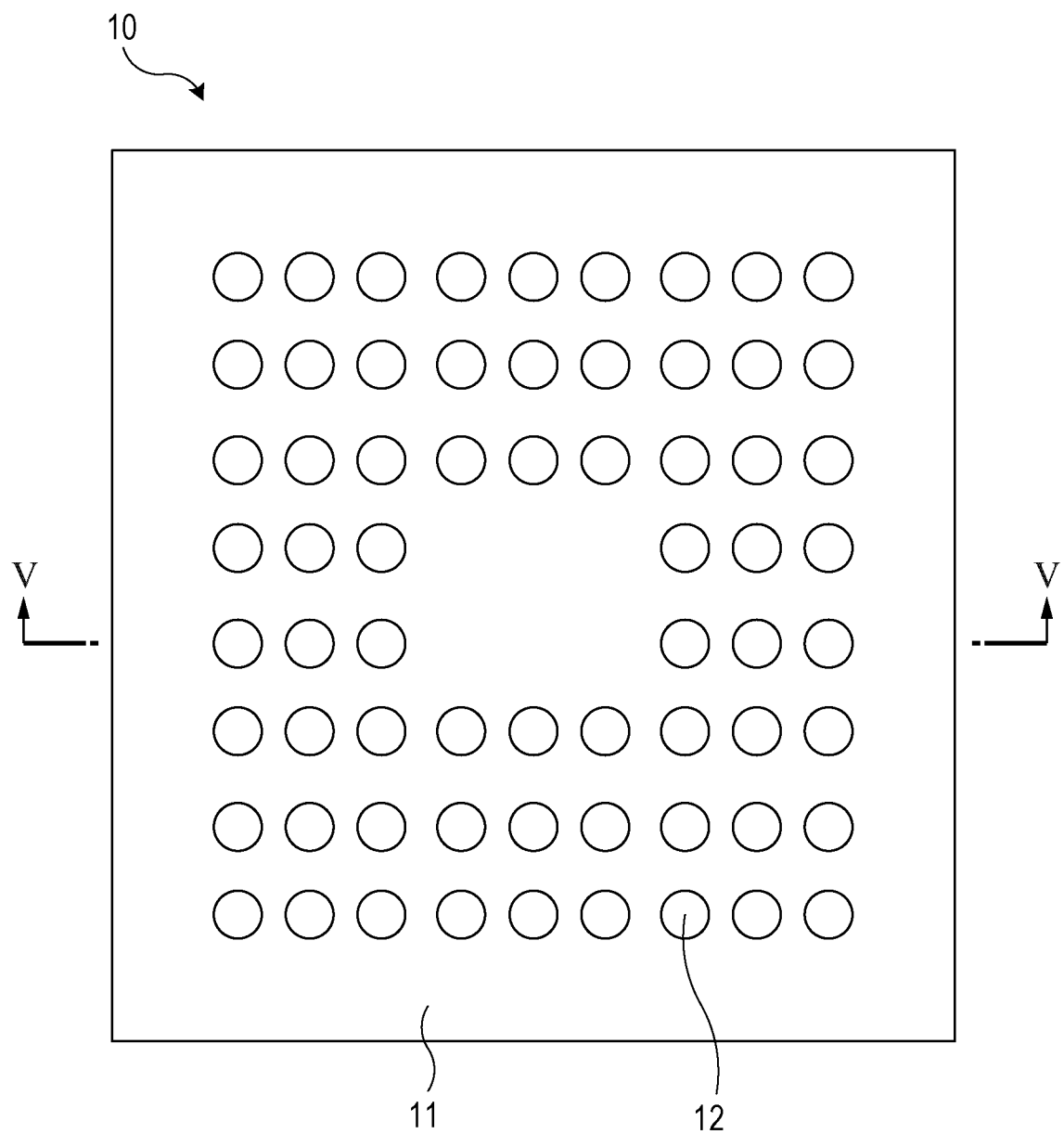
FIG. 6 is a diagram illustrating an example of a circuit substrate according to the first embodiment (Part 2)
Figure 7:
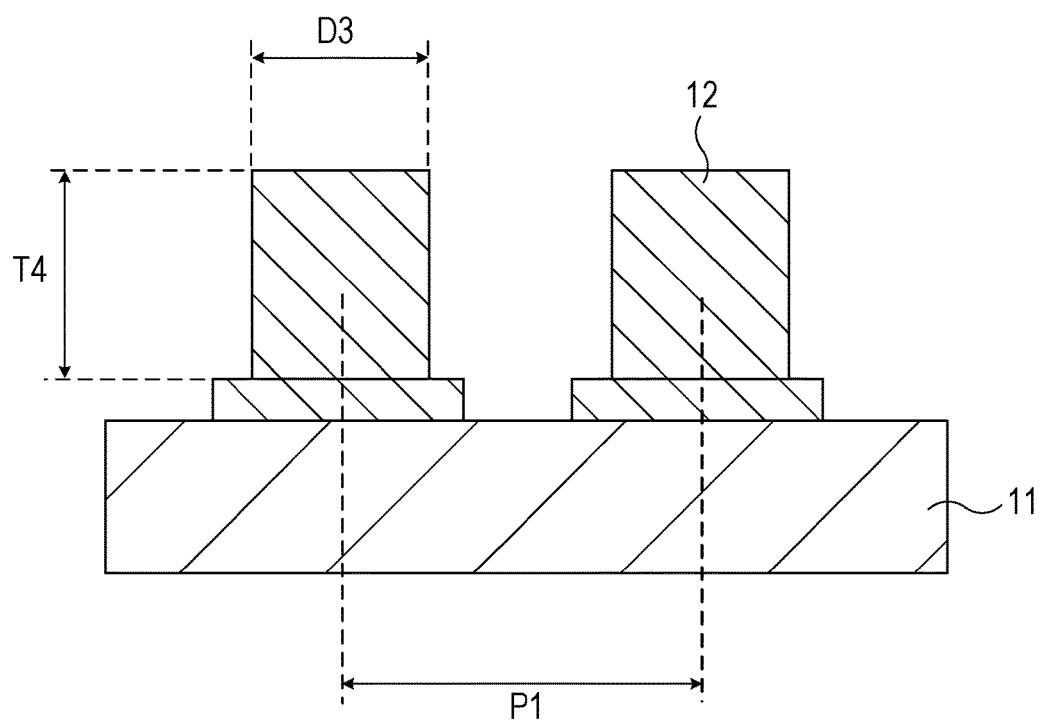
FIG. 7 is a diagram illustrating an example of a circuit substrate according to the first embodiment (Part 3)

The electronic part package 20 having the above-described configuration is mounted on a circuit substrate, such as a motherboard, or the like. FIG. 5 to FIG. 7 are diagrams illustrating an example of a circuit substrate according to the first embodiment. FIG. 5 is a schematic sectional view of a main part of the example of the circuit substrate according to the first embodiment, FIG. 6 is a schematic plan view of the main part of the example of the circuit substrate according to the first embodiment, and FIG. 7 is a partially enlarged view of the circuit substrate according to the first embodiment. In this regard, FIG. 5 is a schematic sectional view taken along line V-V in FIG. 6, and FIG. 7 is an enlarged view of an VII portion in FIG. 5.

The circuit substrate 10 includes a substrate 11, in which wiring, vias, and the like (not illustrated in the figures) are internally disposed, and projecting terminals 12 disposed on the substrate 11. The projecting terminals 12 are disposed at the positions corresponding to the conductive layers 24 of the electronic part package 20. In this regard, a plurality of projecting terminals 12 are illustrated here as an example. The plurality of projecting terminals 12 are disposed so as to be arranged vertically and horizontally in a matrix state in a plan view as illustrated in FIG. 6, for example. The pitch P1 (FIG. 7) between adjacent projecting terminals 12 is 100 μm, for example.

For the projecting terminals 12, a metallic material having a higher melting point than that of the first conductive part 24a of the conductive layer 24 is used. For the projecting terminals 12, it is possible to use Cu or Au, for example. As the projecting terminals 12, it is possible to dispose pillar electrodes, stud bumps, or the like on the substrate 11. It is possible to form the pillar electrodes by depositing Cu or Au on a predetermined area (electrode) of the substrate 11 using a photo lithography technique and a plating technique, for example. It is possible to form the stud bumps by making a top portion of a wire made of Cu or Au in a ball state, and bonding the top portion on a predetermined area (electrode) of the substrate 11, and pulling off the wire.

As described later, the projecting terminals 12 are connected to the first conductive parts 24a of the conductive layer 24 when the electronic part package 20 is mounted on the circuit substrate 10. At that time, the projecting terminals 12 are inserted into the openings 23c of the wiring layer 23 of the electronic part package 20, and are connected with the first conductive part 24a of the conductive layer 24. Accordingly, the diameter of the projecting terminals 12 is determined to be smaller than a value produced by subtracting the thickness of the wiring 23b formed in the opening 23c from the diameter D2 of the opening 23c of the electronic part package 20. The height of the projecting terminals 12 is determined to be a height that the projecting terminal 12 reaches the first conductive part 24a when the electronic part package 20 is mounted on the circuit substrate 10, that is to say, a smaller value than the sum value of the thickness T3 of the wiring layer 23 and the thickness T1 of the first conductive part 24a.

The diameter D3 (FIG. 7) of the projecting terminals 12 is 50 μm, for example, and the height T4 (FIG. 7) is 50 μm, for example. A description will be given of the method of mounting the electronic part package 20 on the circuit substrate 10 with reference to FIG. 8 and FIG. 9.

Figure 8:
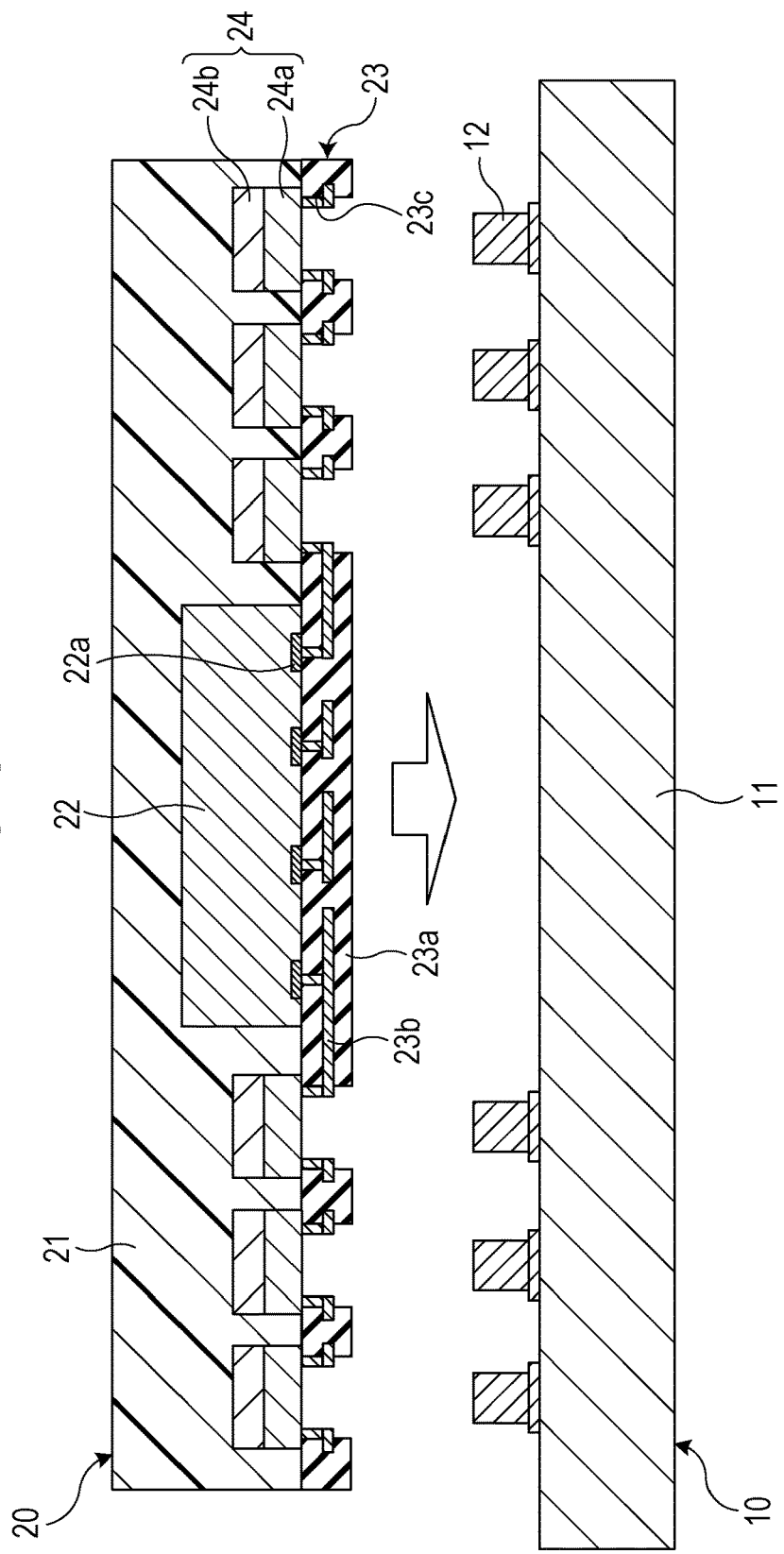
FIG. 8 is a diagram illustrating an example of a mounting process according to the first embodiment (Part 1.
Figure 9:
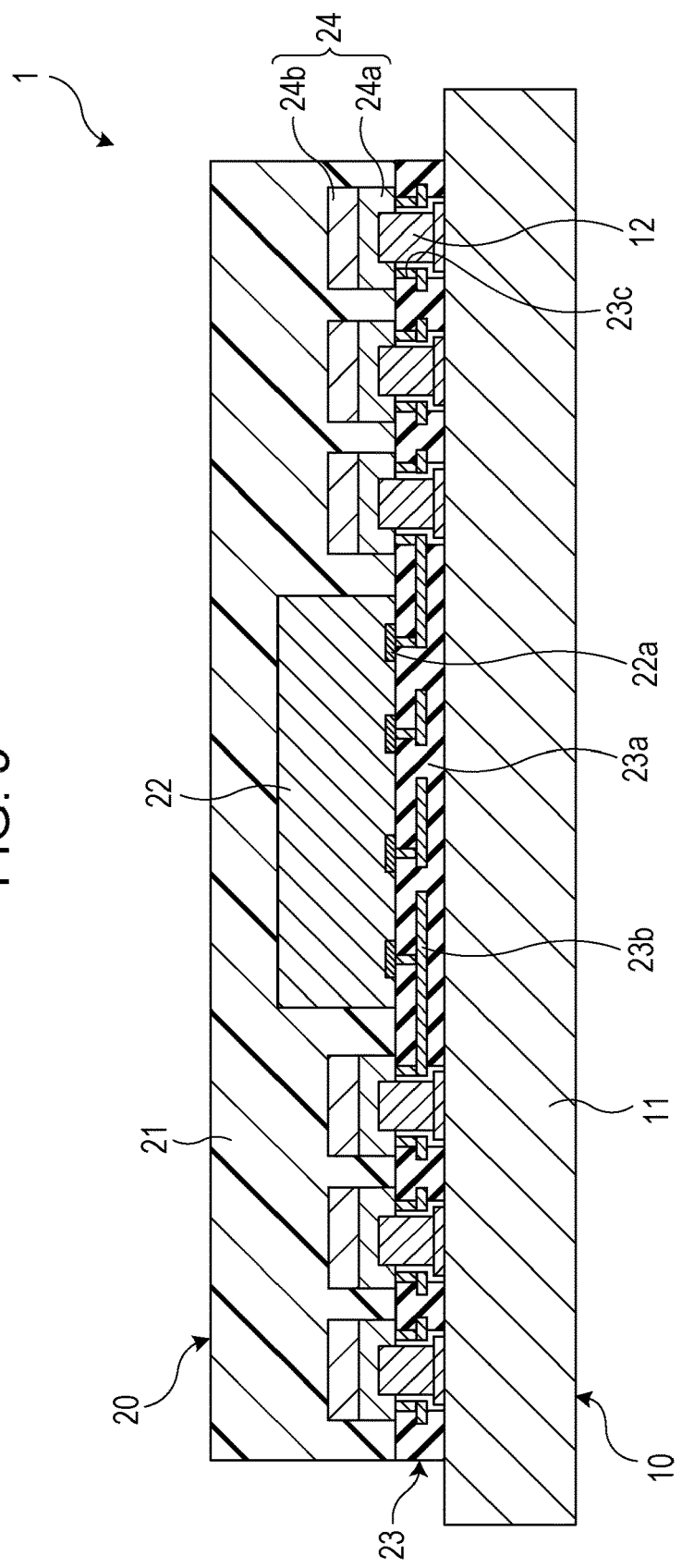
FIG. 9 is a diagram illustrating an example of a mounting process according to the first embodiment (Part 2)

FIG. 8 and FIG. 9 are diagrams illustrating an example of a mounting process according to the first embodiment. FIG. 8 is a schematic sectional view of a main part of the example in a state before the mounting, and FIG. 9 is a schematic sectional view of the main part of the example in a state after the mounting.

At the time of mounting, first, the electronic part package 20 and the circuit substrate 10 described above are prepared. The prepared electronic part package 20 and circuit substrate 10 are disposed in opposed positions such that the positions of the conductive layers 24 and the projecting terminals 12 match as illustrated in FIG. 8. Then, for example, the electronic part package 20 is brought close to the circuit substrate 10, and the projecting terminals 12 having a predetermined height of the circuit substrate 10 are inserted into the openings 23c of the electronic part package 20 as illustrated in FIG. 9 to be brought into contact with the first conductive part 24a in the openings 23c. Before the contact or after the contact, reflowing is performed at a melting temperature of the first conductive part 24a, which is lower than the melting points of the projecting terminal 12, and the second conductive part 24b so that the first conductive part 24a and the projecting terminals 12 are connected. After that, the first conductive part 24a that has melted by the reflowing is solidified by cooling.

In this manner, a package module 1 in which the electronic part package 20 is mounted on the circuit substrate 10 is obtained. Here, when reflowing is performed at the time of the connection described above, since the first conductive part 24a is provided with the second conductive part 24b formed by the material getting wet to the material of the first conductive part 24a on the top of the first conductive part 24a, the melted first conductive part 24a is held at the second conductive part 24b side, and thus the melted first conductive part 24a is avoided moving to the circuit substrate 10 side by flowing from the projecting terminals 12. Accordingly, it is possible to suppress invasion of the conductive material to the boundary face between the electronic part package 20 (the wiring layer 23) and the circuit substrate 10, and the occurrence of a short circuit between different terminals.

In order to effectively suppress movement of the first conductive part 24a to the circuit substrate 10 side by flowing from the projecting terminals 12 at such connection time, it is desirable that the volume of the second conductive part 24b is larger than the volume of the projecting terminal 12 that is in contact with the first conductive part 24a. At the time of preparing the electronic part package 20, it is desirable that the second conductive part 24b is shaped so as to effectively suppress movement of the first conductive part 24a to the circuit substrate 10 at the time of connection with the circuit substrate 10.

As described above, in the electronic part package 20, the conductive layer 24 to be terminals is buried in the resin layer 21, and the wiring layer 23 is provided with the openings 23c that reaches the conductive layer 24. The circuit substrate 10 to be connected is provided with the projecting terminals 12 correspondingly to the conductive layer 24 of the electronic part package 20. At the time of connection, the projecting terminals 12 are inserted into the openings 23c in order to connect the first conductive part 24a of the conductive layer 24 and the projecting terminals 12.

The conductive layer 24 to be the terminals is buried in the resin layer 21 so that it becomes possible to keep the pitch of the terminals smaller compared with the case of using the ball-state bumps 240 as illustrated in FIG. 1. For example, it becomes possible to narrow the pitch of the terminals to less than or equal to ¼ the previous pitch, for example, from 400 μm (P0) to 100 μm (P1). By narrowing the pitch of the terminals, the planar size of the electronic part package 20 is miniaturized, and the footprint on the circuit substrate 10 is reduced. The advantages of such miniaturization, and reduction become greater as the number of terminals of the electronic part package 20 increases. Depending on the number of terminals, it is possible to make the footprint of the electronic part package 20, for example less than or equal to 1/10 compared with the case of using the ball-state bump 240 as illustrated in FIG. 1.

Also, it becomes possible to keep the mounting height of the electronic part package 20 on the circuit substrate 10 lower compared with the case of using the ball-state bump 240 as illustrated in FIG. 1. For example, it is possible to lower the mounting height of the electronic part package 20 to less than or about ⅔, for example from 600 μm or more (the thickness T0 of the resin layer 210, the thickness t0 of the wiring layer 230, and the height H0 of the bump 240) to about 400 μm (the thickness of the resin layer 21, and the thickness Tw of the wiring layer 23).

With the first embodiment, it is possible to achieve a low height electronic part package 20 having a small footprint (planar size) without having projecting terminals like the bumps 240. Further, it is possible to achieve the low height package module 1 having a small planar size or a high packaging density using such electronic part package 20.

Next, a description will be given of a method of forming the electronic part package 20. FIG. 10 to FIG. 16E are diagrams illustrating an example of a method of forming an electronic part package according to the first embodiment. FIG. 10 to FIG. 16E schematically illustrate sectional views of a main part of the corresponding forming processes of the electronic part package 20 as described above. In the following, a description will be given of an example of a method of forming the electronic part package 20 with reference to FIG. 10 to FIG. 16E. In this regard, here, attention is focused on one of the electronic part packages 20, and a description will be given of an example of the method of forming it.

Figure 10:
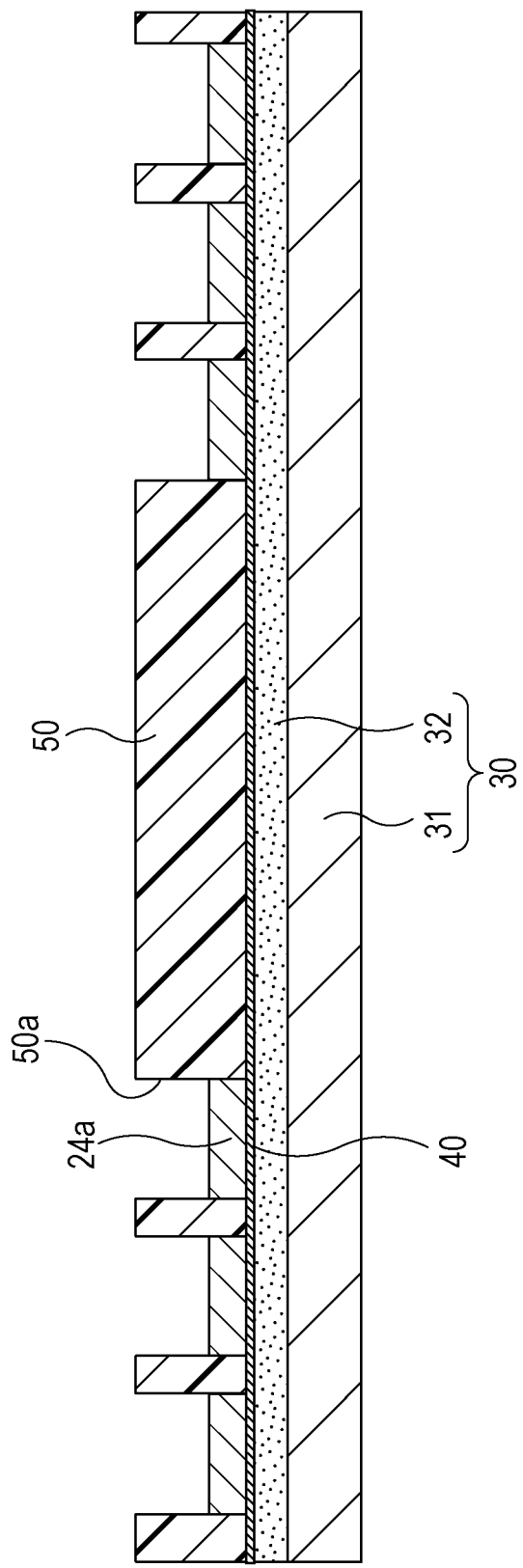
FIG. 10 is a diagram illustrating an example of a method of forming an electronic part package according to the first embodiment (Part 1)

FIG. 10 is a diagram illustrating an example of a forming process of the first conductive part. First, a supporting body 30, as illustrated in FIG. 10, in which an adhesive layer 32 is disposed on a supporting substrate 31 is prepared. For the supporting substrate 31, it is possible to use a metallic substrate, such as a stainless steel, or the like, a semiconductor substrate, such as Si or the like, a glass substrate, a ceramic substrate, or the like. It is possible to use various materials having adhesion for the adhesive layer 32. For example, it is possible to use a layered material having adhesive force that is allowed to be lowered by ultraviolet light irradiation, chemical treatment, heat treatment, or the like, in addition to a sheet material allowed to be detached from an attached object (an adhesive sheet, and a slightly adhesive sheet). For an example, a supporting body 30 in which a slightly adhesive sheet is attached as the adhesive layer 32 on an 8-inch square supporting substrate 31 made of stainless steel is prepared.

As illustrated in FIG. 10, a seed layer 40 is formed on the adhesive layer 32 of the prepared supporting body 30. For the seed layer 40, a laminated body of a titanium (Ti) layer and a Cu layer are formed using a sputtering method, for example. For example, a Ti layer having a thickness of 0.1 μm is formed, and a Cu layer having a thickness of 0.3 μm is formed thereon.

After the seed layer 40 is formed as illustrated in FIG. 10, a resist 50 is formed thereon, and openings 50a are formed at a predetermined pitch in a matrix state in areas in which a conductive layer 24 is formed except in an area where the electronic part 22 is disposed. For example, a dry film resist having a thickness of 100 μm is disposed on the seed layer 40 as a resist 50, and the openings 50a are formed to have an opening diameter of 100 μm, and an opening pitch of 100 μm in a matrix state.

In this manner, after the openings 50a are formed on the resist 50, a first conductive part 24a is formed on the seed layer 40 of the openings 50a of the resist 50 as illustrated in FIG. 10 by an electroplating method using the seed layer 40 as a power supply layer. For example, an SnAg solder, which is a low melting point metal, is formed to have a thickness of 50 μm on the seed layer 40 of the openings 50a as the first conductive part 24a.

Figure 11:
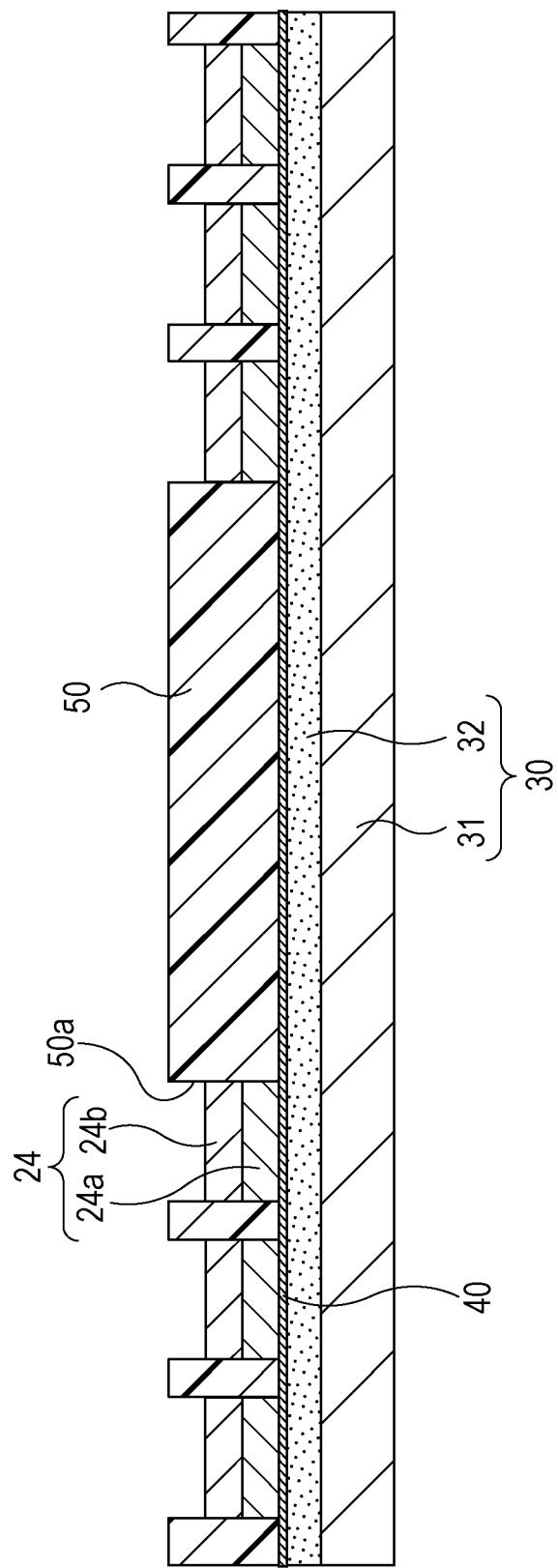
FIG. 11 is a diagram illustrating an example of a method of forming an electronic part package according to the first embodiment (Part 2)

FIG. 11 is a diagram illustrating an example of a forming process of a second conductive part. After the first conductive part 24a is formed on the seed layer 40 of the openings 50a of the resist 50, as illustrated in FIG. 11, a second conductive part 24b is subsequently formed on the first conductive part 24a of the openings 50a using the electroplating method. For example, when the SnAg solder is formed as the first conductive part 24a, a Cu layer, which is a metal getting wet with a melted SnAg solder, is formed to have a thickness of 30 μm on the first conductive part 24a.

Figure 12:
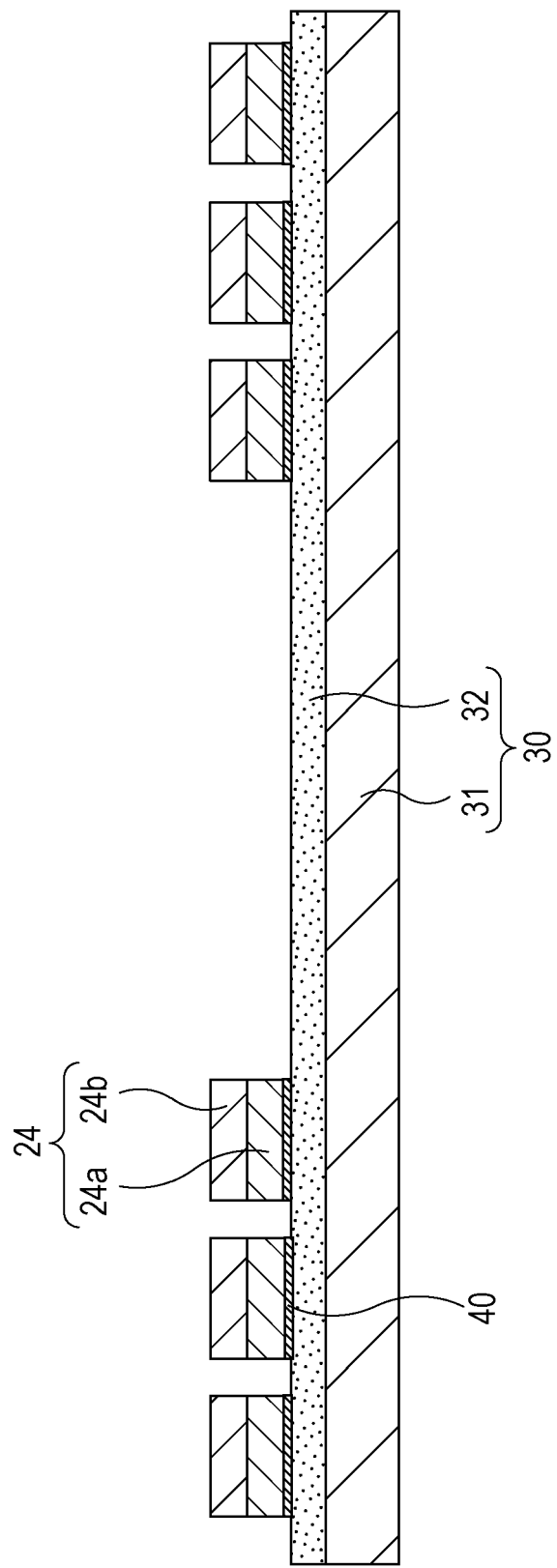
FIG. 12 is a diagram illustrating an example of a method of forming an electronic part package according to the first embodiment (Part 3)

Thereby, the conductive layer 24 including the first conductive part 24a and the second conductive part 24b is formed on the seed layer 40. FIG. 12 is a diagram illustrating an example of a removing process of the resist and the seed layer.

After the second conductive part 24b is formed, as illustrated in FIG. 12, the resist 50 is removed, and the seed layer 40 that is exposed after the removal of the resist 50 is removed. It is possible to remove the resist 50 by dissolving using chemical liquid, or detaching. For example, when the seed layer 40 is formed by a laminated body of a Ti layer and a Cu layer, it is possible to remove the Cu layer, which is the upper layer of the seed layer 40, first by wet etching, and next to remove the Ti layer, which is the lower layer, by dry etching.

Figure 13:
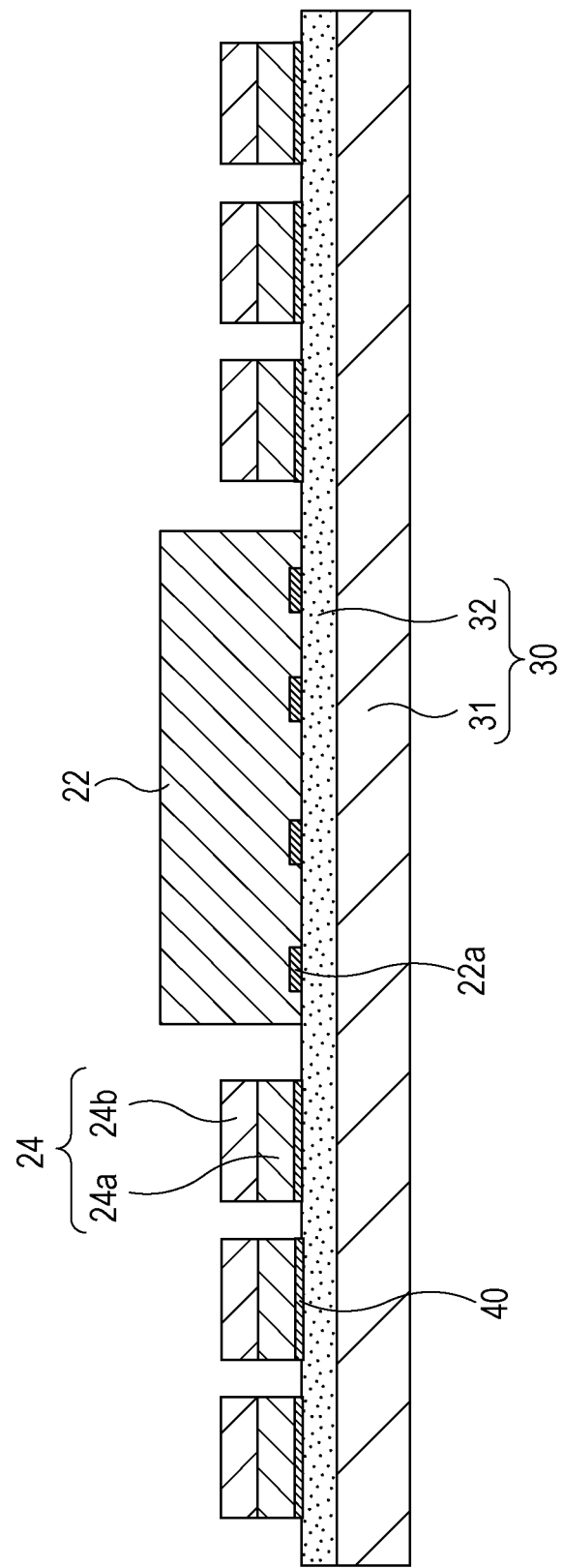
FIG. 13 is a diagram illustrating an example of a method of forming an electronic part package according to the first embodiment (Part 4.

FIG. 13 is a diagram illustrating an example of a disposing process of the electronic part. After the resist 50 and the seed layer 40 are removed, the electronic part 22 of a semiconductor device, or the like is disposed (attached) on a predetermined area of the adhesive layer 32 of the supporting body 30, which has been exposed by the removal, with its terminals 22a facing the adhesive layer 32 as illustrated in FIG. 13. For example, an Si bare chip, which is a 5-mm square and has a thickness of 0.4 mm, is disposed on the adhesive layer 32 with its terminals 22a facing down on the adhesive layer 32 using a chip mounter.

Figure 14:
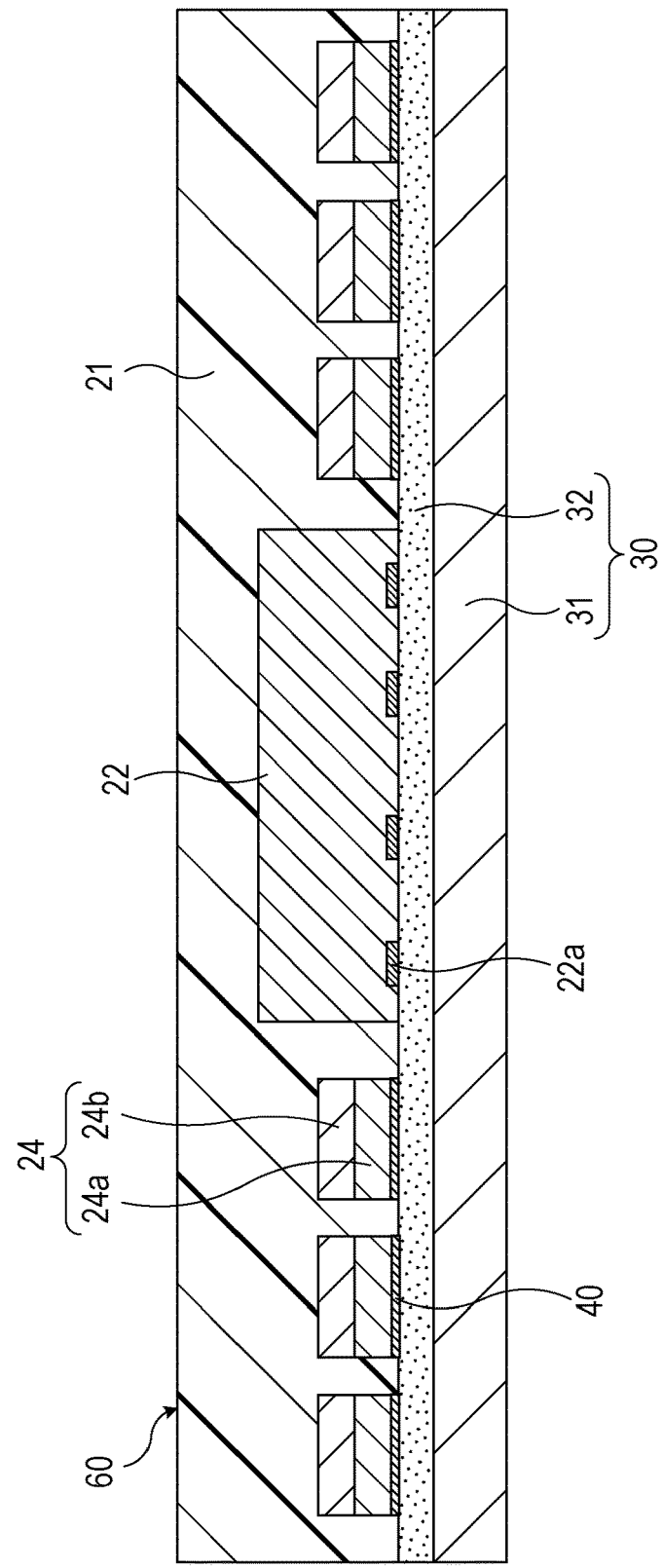
FIG. 14 is a diagram illustrating an example of a method of forming an electronic part package according to the first embodiment (Part 5)

FIG. 14 is a diagram illustrating an example of a forming process of a resin layer. After the electronic part 22 is disposed on the adhesive layer 32, the conductive layer 24 and the electronic part 22 are sealed on the adhesive layer 32 with the resin layer 21 as illustrated in FIG. 14. For example, resin to be the resin layer 21 or resin (resin composition) including a filler is poured on the adhesive layer 32, on which the conductive layer 24 and the electronic part 22 are disposed, and the resin is cured using a method of application of heat, application of ultraviolet light irradiation, or the like to form the resin layer 21. For example, the substrate is formed in a 6-inch size wafer-state with the resin layer 21 having a thickness of 400 µm to 600 µm.

Thereby, a pseudo wafer 60 including the resin layer 21 in which the electronic part 22 and the conductive layer 24 are buried is formed. In this regard, after the resin layer 21 is formed, the resin layer 21 may be polished from the opposite side of the supporting body 30 in order to thin the pseudo wafer 60. It is possible to polish the resin layer 21 such that the upper face (rear face) of the electronic part 22 is not exposed, or such that the upper face of the electronic part 22 is exposed. Alternatively, it is also possible to polish the resin layer 21 so as to polish a part of the upper face of the electronic part 22 in addition to the resin layer 21.

FIG. 15 is a diagram illustrating an example of removing process of the supporting body and the seed layer. After the pseudo wafer 60 is formed, as illustrated in FIG. 15, the pseudo wafer 60 and the supporting body 30 (the supporting substrate 31 and the adhesive layer 32) are separated. Then, the seed layer 40 formed under the conductive layer 24 (the first conductive part 24a) is removed after the supporting body 30 is separated.

Thereby, the pseudo wafer 60 is formed in which the individual terminals 22a and the first conductive part 24a of the electronic part 22 and the conductive layer 24, respectively, which are buried in the resin layer 21, are exposed from a first face 21a of the resin layer 21.

The wiring layer 23 is formed on the pseudo wafer 60 formed in this manner so that the electronic part package 20 as illustrated in FIG. 2, or the like is obtained. FIGS. 16A to 16E are diagrams illustrating examples of forming processes of the wiring layer. Here, attention is focused on a part of the pseudo wafer 60, and a description will be given of an example of a method of forming the wiring layer 23.

Figure 16A:
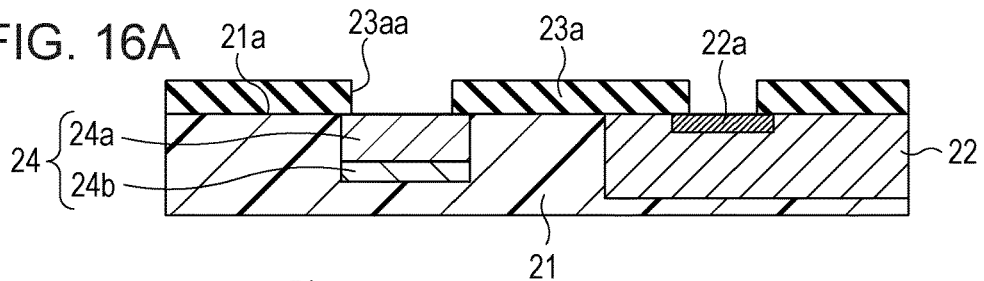
FIGS. 16A to 16E are diagrams illustrating an example of a method of forming an electronic part package according to the first embodiment (Part 7)

First, as illustrated in FIG. 16A, an insulating part 23a (a part) of the wiring layer 23 is formed on the face (the first face 21a) of the pseudo wafer 60 from which the adhesive layer 32 has been separated. The insulating part 23a is provided with openings 23aa in the areas corresponding to the terminals 22a of the electronic part 22, and the first conductive part 24a of the conductive layer 24. For example, photosensitive resin, such as photosensitive epoxy, photosensitive polybenzoxazole, or photosensitive polyimide, is applied on a predetermined face of the pseudo wafer 60, for example. After that, exposure, development, and cure are conducted to form openings 23aa that communicate with the terminals 22a and the first conductive part 24a. After curing, plasma treatment may be performed.

Figure 16B:
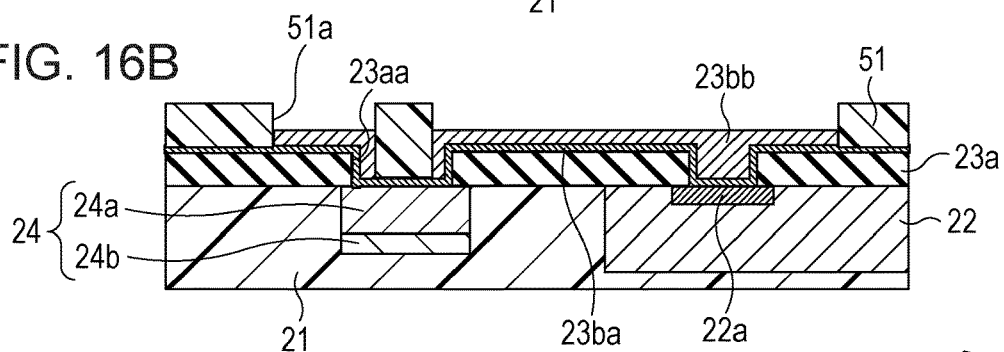
Figure 16C:
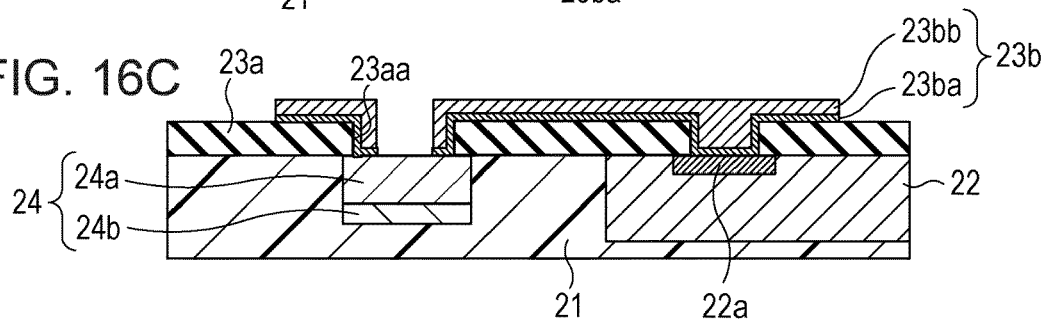

As illustrated in FIG. 16B, a conductive material 23bb is formed on the insulating part 23a formed in this manner. For example, a seed layer 23ba is formed on the insulating part 23a including the inside of the opening 23aa, and a resist 51 including an opening 51a is formed in an area forming a wiring 23b. Then, a conductive material 23bb, such as Cu, or the like, to be the wiring 23b is formed by an electroplating method using the seed layer 23ba as a power supply layer. After that, a resist 51 is removed, and the seed layer 23ba that is exposed after the resist 51 is removed. Thereby, as illustrated in FIG. 16C, the wiring 23b (the seed layer 23ba and the conductive material 23bb) is formed.

Figure 16D:
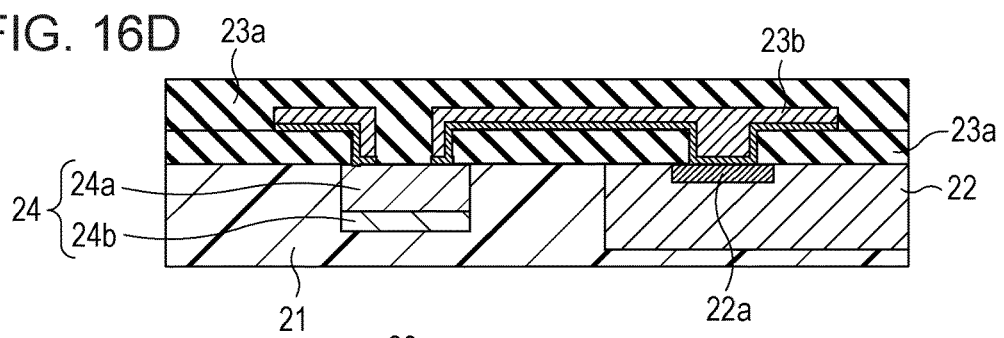
Figure 16E:
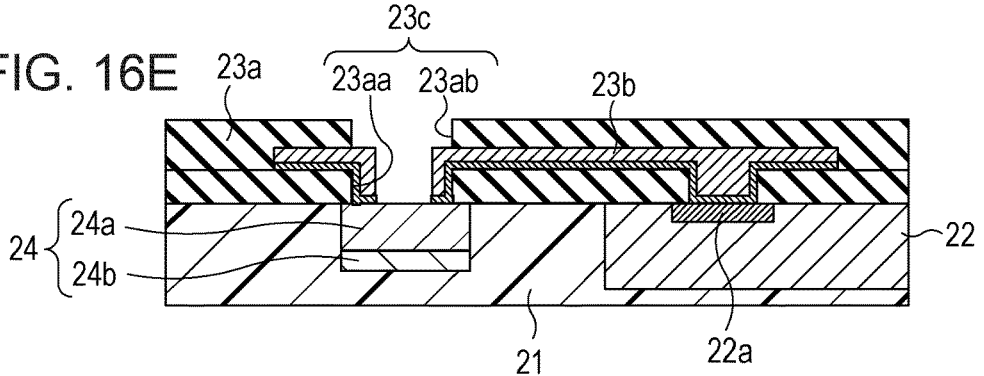

After the wiring 23b is formed, as illustrated in FIG. 16D, an insulating part 23a (a part) of the wiring layer 23 is formed, for example by applying photosensitive resin in the same manner as described above. After that, exposure, development, and cure are conducted. As illustrated in FIG. 16E, an opening 23ab communicating with the opening 23aa leading to the first conductive part 24a is formed, and an opening 23c (the opening 23aa and the opening 23ab) of the wiring layer 23 is formed.

In this regard, when a second layer wiring is formed in the wiring layer 23, in the process of FIG. 16D described above, an opening is formed in the connection area with the first layer wiring 23b, a wiring, an insulating part, and an opening 23c are formed in accordance with the example of the processes in FIG. 16B to FIG. 16E.

For example, it is possible to form a wiring layer 23 provided with an opening 23c leading to the first conductive part 24a of the conductive layer 24 using the method as described above. After the wiring layer 23 is formed on the pseudo wafer 60 as illustrated in FIGS. 16A to 16E, the pseudo wafer 60 is separated by dicing, and individual electronic part packages 20 are obtained.

By the above-described processes, the electronic part package 20 as illustrated in FIG. 2 is obtained. The obtained electronic part package 20 and the circuit substrate 10 are connected as illustrated in FIG. 8 and FIG. 9 so that the package module 1 is obtained.

Here, the circuit substrate 10 that are connected with the electronic part package 20 is obtained as follows, for example. First, a substrate 11 internally provided with conductive parts, such as wiring, vias, and the like is formed. Then, projecting terminals 12 that are electrically connected to the internal conductive parts, respectively are formed in areas corresponding to the conductive layers 24 of the electronic part package 20 on the substrate 11. It is possible to form the projecting terminals 12 using Cu, for example. In that case, for example, after a resist including openings at predetermined areas where the projecting terminals 12 are formed by a photolithograpy technique using a dry film resist is formed, Cu is deposited using a plating technique. Thereby, Cu projecting terminals 12 are formed on the predetermined areas of the substrate 11. For example, the projecting terminals 12 having a diameter of 50 μm, a height of 50 μm, and a pitch of 100 μm are formed.

The circuit substrate 10 obtained in this manner and the electronic part package 20 described above are connected, for example by reflowing at 260° C. in accordance with the example in FIG. 8 and FIG. 9 so that the package module 1 is obtained. At connection time, as described above, the conductive layer 24 of the electronic part package 20 includes the first conductive part 24a connected to the projecting terminals 12 of the circuit substrate 10, and the second conductive part 24b thereon, and thus movement of the melted first conductive part 24a to the circuit substrate 10 side by flowing from the projecting terminals 12 is suppressed. Thereby, the occurrence of a short circuit between terminals, which is caused by invasion of the conductive material to the boundary face between the electronic part package 20 and the circuit substrate 10, is suppressed. Electrical tests were conducted on the package module 1 obtained as described above, and the confirmation was made that signal transmission was carried out without problems.

Using the above-described electronic part package 20 and circuit substrate 10, the low-height package module 1 having a small planar size or a high packaging density is achieved. Next, a description will be given of a second embodiment.

Figure 17:
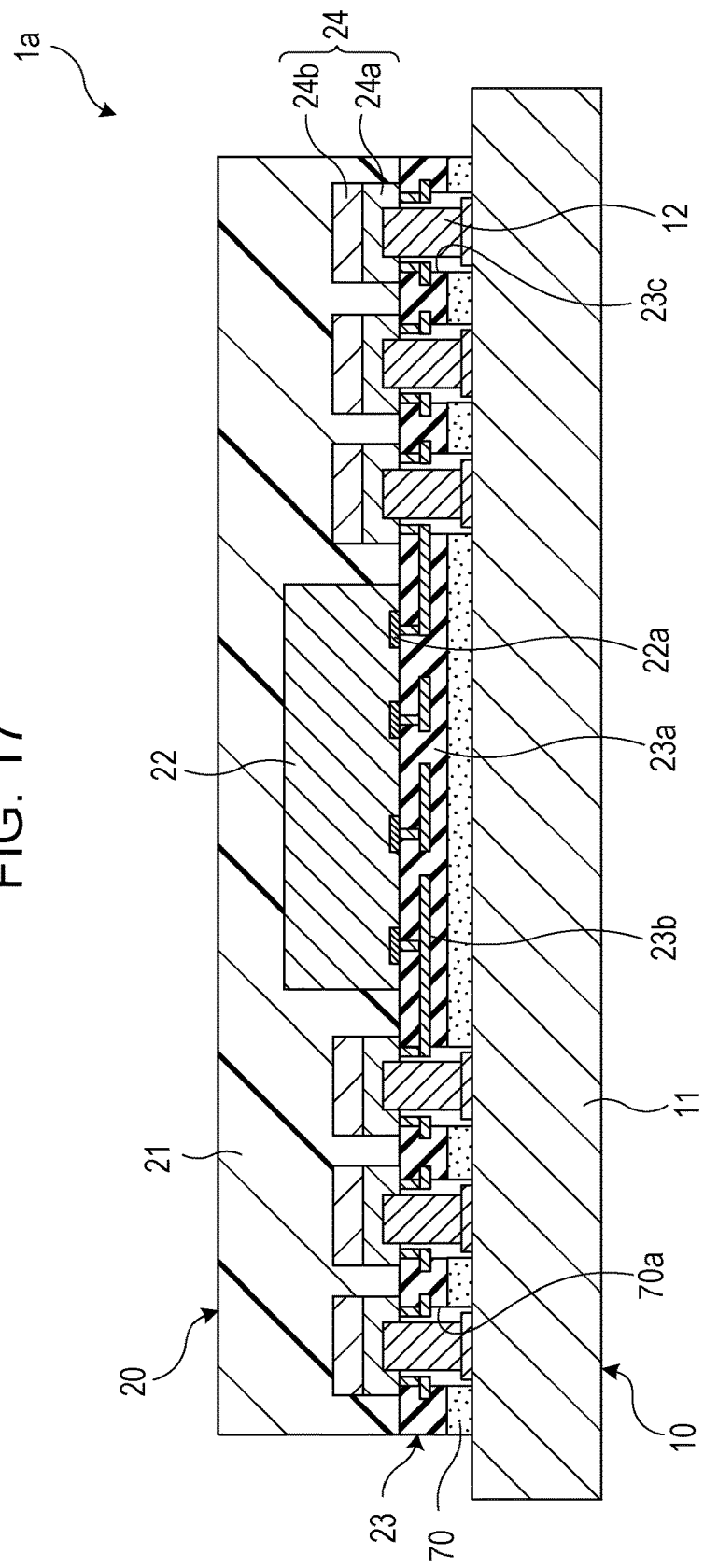
FIG. 17 is a diagram illustrating an example of a package module according to a second embodiment.

FIG. 17 is a diagram illustrating an example of a package module according to the second embodiment. FIG. 17 is a schematic sectional view of a main part of an example of the package module according to the second embodiment. In a package module 1a illustrated in FIG. 17, an electronic part package 20 and a circuit substrate 10 are connected through an adhesive material 70. Projecting terminals 12 of the circuit substrate 10 have a height T4 (FIG. 7) so as to be connected with the first conductive part 24a of the electronic part package 20 disposed on the circuit substrate 10 through the adhesive material 70 at the time of connection. The package module is according to the second embodiment is different from the package module 1 according to the first embodiment on the point of having such a configuration.

It is possible to form the package module is as illustrated in FIG. 17 as follows, for example. First, a dry film resist, such as photosensitive epoxy, or the like is laminated on the front face of the wiring layer 23 of the electronic part package 20 in FIG. 2, which is obtained by the above-described processes illustrated in FIG. 10 to FIG. 16E according to the first embodiment, as the adhesive material 70. Then, openings 70a leading the conductive layer 24 (first conductive part 24a) are formed on the dry film resist, which is the adhesive material 70, using a photolithograpy technique. After that, the dry film resist, that is to say, the adhesive material 70 is pre-baked (semi-cured) at 120° C.

The electronic part package 20 provided with the adhesive material 70 including the openings 70a, and the circuit substrate 10 provided with the projecting terminals 12 are connected by reflowing in accordance with the example in FIG. 8 and FIG. 9 described above. At that time, the projecting terminals 12 of the circuit substrate 10 are inserted into the openings 70a of the adhesive material 70 and the openings 23c of the wiring layer 23 to be connected with the first conductive part 24a of the conductive layer 24. At the same time, the semi-cured state adhesive material 70 disposed on the wiring layer 23 of the electronic part package 20 gets into touch with the circuit substrate 10. The adhesive material 70 is cured at the time of reflowing, and thereby, the electronic part package 20 (wiring layer 23) and the circuit substrate 10 are adhered with the adhesive material 70.

In this manner, the electronic part package 20, and the circuit substrate 10 are adhered with the adhesive material 70 so that it is possible to achieve the package module is having high impact-resistance, high durability, and high reliability.

In this regard, here a method of using a photosensitive dry film resist as the adhesive material 70 is exemplified. In addition, the following method may be employed. The electronic part package 20 illustrated in FIG. 2 and the circuit substrate 10 provided with the projecting terminals 12 having a predetermined height may be connected in accordance with the example in FIG. 8 and FIG. 9 with gaps between these. Then after the connection, resin (underfill resin, or the like) to be the adhesive material 70 may be filled in the gaps. It is possible to obtain the package module is having high durability, and high reliability using such a method in the same manner.

Figure 18:
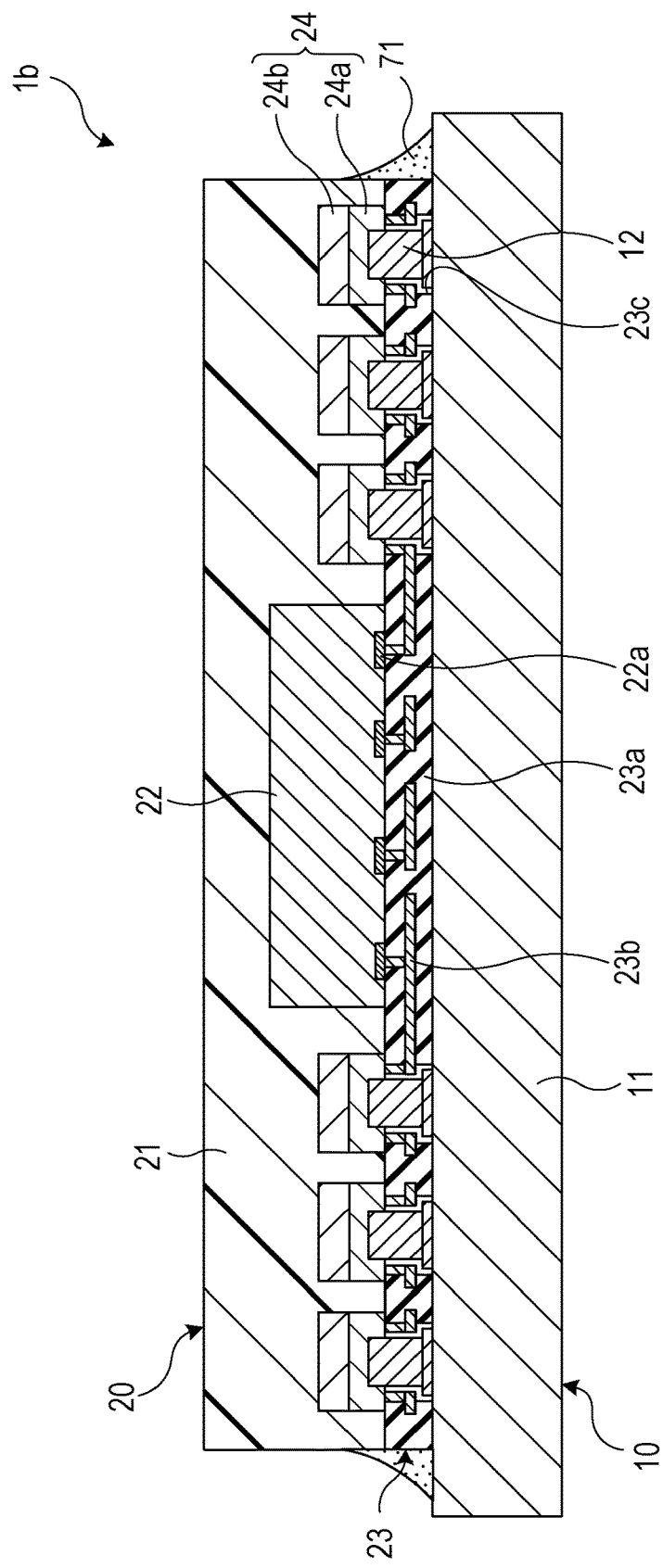
FIG. 18 is a diagram illustrating an example of a package module according to a third embodiment.

Next, a description will be given of a third embodiment. FIG. 18 is a diagram illustrating an example of a package module according to the third embodiment. FIG. 18 is a schematic sectional view of a main part of the example of the package module according to the third embodiment.

A package module 1b illustrated in FIG. 18 is different from the package module 1 according to the first embodiment in that a adhesive material 71 which attaches the circuit substrate 10 to the electronic part package 20 is provided at the outside of the electronic part package 20 that is connected to the circuit substrate 10.

It is possible to obtain the package module 1b as illustrated in FIG. 18 by connecting the electronic part package 20 and the circuit substrate 10 as illustrated in FIG. 8 and FIG. 9, then applying resin (underfill resin, or the like) to be the adhesive material 71 on the periphery of the electronic part package 20, and curing the resin. In this regard, the adhesive material 71 does not have to be provided continuously all around the electronic part package 20. The adhesive material 71 may be provided intermittently on the periphery of the electronic part package 20.

By connecting the electronic part package 20 and the circuit substrate 10 with the adhesive material 71 in this manner, it is possible to achieve the package module 1b that has high impact-resistance, high durability, and high reliability.

Next, a description will be given of a fourth embodiment.

In the first to the third embodiments, the examples of the cases where one electronic part 22 is buried in the resin layer 21 have been illustrated. However, a plurality of electronic parts 22 may be buried in the resin layer 21.

Figure 19:
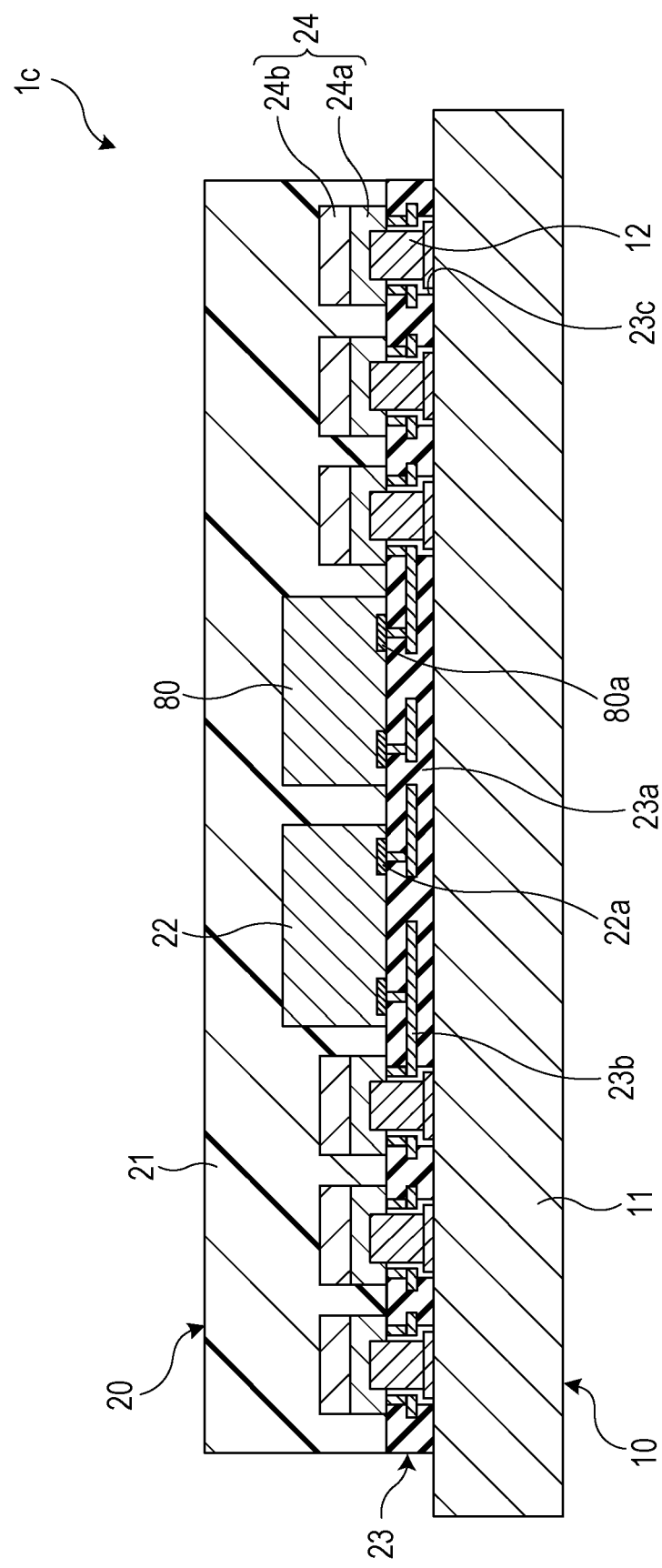
FIG. 19 is a diagram illustrating a first example of a package module according to a fourth embodiment.

FIG. 19 is a diagram illustrating a first example of a package module according to the fourth embodiment. FIG. 19 is a schematic sectional view of a main part of the first example of the package module according to the fourth embodiment.

A package module is illustrated in FIG. 19 is different from the package module 1 according to the first embodiment in that the electronic part 22 and an electronic part 80 are buried in the resin layer 21. For example, it is possible to use an active part, such as a semiconductor device, or the like for the electronic part 80 in the same manner as the electronic part 22. In the resin layer 21, a conductive layer 24 is buried such that the electronic part 22 (terminals 22a) and the electronic part 80 (terminals 80a) are electrically connected to the wiring 23b of the wiring layer 23.

Thereby, it becomes possible to achieve a multi-functional and high-performance package module 1c.

In this regard, two parts, namely the electronic part 22 and the electronic part 80, are illustrated in the sectional view in FIG. 19. However, it is possible to bury three electronic parts or more in the resin layer 21.

Also, it is possible to apply a configuration of burying a plurality of electronic parts in the resin layer 21 in the same manner to the package module is according to the second embodiment, and the package module 1b according to the third embodiment.

Figure 20:
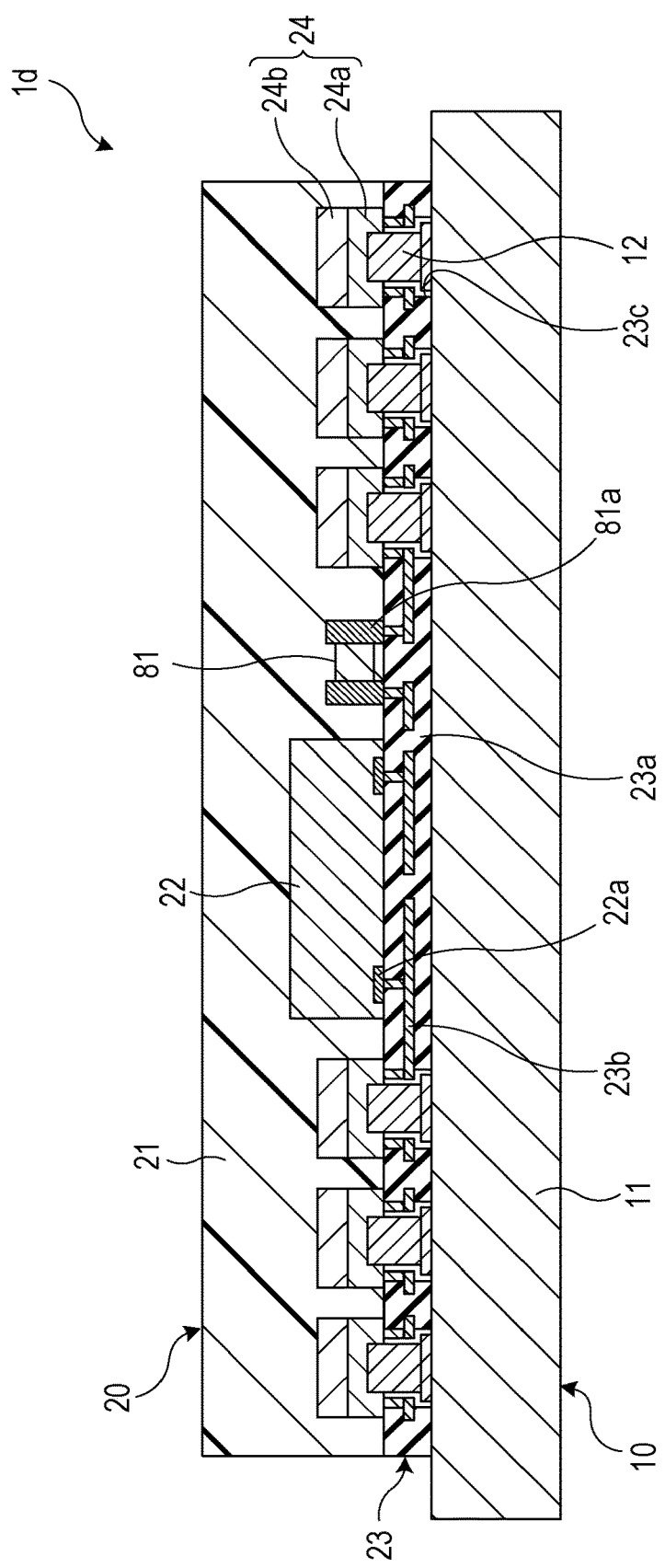
FIG. 20 is a diagram illustrating a second example of the package module according to the fourth embodiment.

FIG. 20 is a diagram illustrating a second example of a package module according to a fourth embodiment. FIG. 20 is a schematic sectional view of a main part of the second example of the package module according to the fourth embodiment. A package module 1d illustrated in FIG. 20 is different from the package module 1 according to the first embodiment in that the electronic part 22 and an electronic part 81 are buried in the resin layer 21 in the sectional view. For example, it is possible to use an active part, such as a semiconductor device, or the like for the electronic part 22, and a passive part, such as a chip capacitor, or the like for the electronic part 81. In the resin layer 21, a conductive layer 24 is buried such that the electronic part 22 (terminals 22a) and the electronic part 81 (terminals (electrodes) 81a) are electrically connected to the wiring 23b of the wiring layer 23.

Thereby, it becomes possible to achieve the multi-functional and high-performance package module 1d.

In this regard, each one of the electronic part 22 and the electronic part 81 are illustrated in a sectional view in FIG. 20. However, it is possible to bury, in the resin layer 21, a plurality of active parts, such as the electronic parts 22, and a plurality of passive parts, such as the electronic parts 81.

Also, it is possible to apply a configuration of burying a plurality of electronic parts in the resin layer 21 in the same manner to the package module is according to the second embodiment, and the package module 1b according to the third embodiment.

Next, a description will be given of a fifth embodiment.

FIG. 21 is a diagram illustrating an example of a package module according to the fifth embodiment. FIG. 21 is a schematic sectional view of a main part of the example of the package module according to the fifth embodiment.

A package module 1e illustrated in FIG. 21 includes a face (rear face) opposed to the disposition face of the terminals 22a of the electronic part 22, which is exposed from the resin layer 21, and an electronic part package 20e provided with a second wiring layer 25 (re-wiring layer) disposed on the electronic part 22 and the resin layer 21. The wiring layer 25 includes an insulating part 25a, and wiring 25b (re-wiring) disposed in the insulating part 25a. The wiring layer 23 (the wiring 23b thereof) and the wiring layer 25 (the wiring 25b thereof), which are disposed to sandwich the resin layer 21 on the lower side and the upper side, respectively, are electrically connected through a conductive part 26 disposed so as to penetrate the resin layer 21.

The electronic part package 20e having such a configuration is connected with the circuit substrate 10 using the conductive layer 24 and the projecting terminal 12, respectively. As illustrated in FIG. 21, another electronic device 90 is connected on the electronic part package 20e using bumps 91 of solder, or the like. It is possible to use a semiconductor device, a semiconductor package including a semiconductor device mounted on a circuit substrate, an electronic part package including an electronic part buried in a resin layer as described above, a circuit substrate, or the like as the electronic device 90.

In this regard, adhesive material, such as underfill resin, or the like may be filled in the gaps between the electronic part package 20e and the electronic device 90 that are connected using the bumps 91 in order to increase the connection strength therebetween.

It is possible to form the electronic part package 20e as illustrated in FIG. 21 as follows, for example.

First, the conductive layer 24 is formed on the adhesive layer 32 of the supporting body 30 in accordance with the example illustrated in FIG. 10 to FIG. 13 according to the first embodiment, and then the electronic part 22 is disposed. After that, before sealing is performed with the resin layer 21 illustrated in FIG. 14, the conductive part 26 is disposed on the adhesive layer 32. For the conductive part 26, it is possible to use a pin using a metal, such as Cu, or the like, for example. After the conductive part 26 is disposed on the adhesive layer 32, the conductive layer 24, the electronic part 22, and the conductive part 26 are sealed with the resin layer 21. After the sealing, the resin layer 21 is polished so that the electronic part 22 and the conductive part 26 are exposed. At that time, a part of the electronic part 22, and a part of the conductive part 26 may be polished together with the resin layer 21.

After such a process, the supporting body 30 is removed in accordance with the example in FIG. 15, and the wiring layer 23 is formed in accordance with FIGS. 16A to 16E. At the time of forming the wiring layer 23, the wiring 23b that is electrically connected with the conductive part 26 is formed in addition to the conductive layer 24. The wiring layer 25 including the wiring 25b that is electrically connected with the conductive part 26 is also formed on the opposite side face of the wiring layer 23 of the resin layer 21 in the same manner.

It is possible to obtain the electronic part package 20e by such a method.

The electronic part package 20e obtained in this manner is connected with the circuit substrate 10 in accordance with the example in FIG. 8 and FIG. 9. The electronic device 90 is connected on the electronic part package 20e using the bumps 91. Thereby, it is possible to obtain the package module 1e as illustrated in FIG. 21.

In this regard, it is possible to connect the conductive part 26 exposed from the resin layer 21 with the electronic device 90 using the bumps 91 with providing the electronic part package 20e without the wiring layer 25. Also, in the electronic part package 20e, the opposite side face of the disposition surface of the terminals 22a of the electronic part 22 does not have to be exposed from the resin layer 21.

With the electronic part package 20e as described above, it becomes possible to three-dimensionally laminate the electronic device 90 on the electronic part package 20e in addition to the advantages obtained in the case of using the electronic part package 20 according to the first embodiment. Thereby, it becomes possible to improve the packaging density on the circuit substrate 10.

In this regard, in the package module 1e according to the fifth embodiment, it is possible to connect the electronic part package 20e and the circuit substrate 10 using the adhesive material 70 as described in the second embodiment, or the adhesive material 71 as described in the third embodiment.

Also, a plurality of the other electronic parts, such as the electronic part 80 and the electronic part 81 described in the fourth embodiment may be buried in the resin layer 21 of the electronic part package 20e according to the fifth embodiment in addition to the electronic part 22.

In the above descriptions, the circuit substrate 10 is exemplified as the connection opposite substrate of the electronic part packages 20 and 20e. For the connection opposite substrate of the electronic part packages 20 and 20e, it is possible to use various electronic parts (substrates), such as a semiconductor device provided with the projecting terminals as described above, a semiconductor package, a pseudo SoC, or the like in addition to the circuit substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
   a resin layer;
   a conductive layer buried in the resin layer;
   an electronic part buried in the resin layer; and
   a wiring layer arranged on the resin layer, the wiring layer including wiring and an opening, the wiring being connected electrically to the conductive layer and the electronic part, the opening communicating with the conductive layer,
   wherein the conductive layer and the electronic part are provided on an upper surface of the wiring layer side by side,
   wherein a substrate including a projecting terminal is provided on an opposite side of the resin layer across the wiring layer and an upper part of the projecting terminal is provided in the conductive layer and a bottom part of the projection terminal is provided in the opening, and
   wherein the wiring includes a first portion which is connected to the conducive layer and is provided on a sidewall of the wiring layer in the opening, a second portion of the wiring which is connected to the first portion at the sidewall of the wiring layer and extends in a direction of a surface of the substrate in the wiring layer and a third portion which is connected to the second portion at an end of the second portion in the wiring layer, extends in a second direction perpendicular to the first direction and is connected to a terminal in the electric part.

2. The electronic device according to claim 1, wherein the conductive layer includes, a first conductive part exposed from the opening, and a second conductive part disposed on an opposite side of the opening on the first conductive part, the second conductive part having a higher melting point than that of the first conductive part, the second conductive part getting wet with the first conductive part when the first conductive part melts.

3. The electronic device according to claim 1, wherein the conductive layer includes a solder layer exposed from the opening.

4. The electronic device according to claim 3, wherein the conductive layer further includes a metal layer on an opposite side to the opening of the solder layer, the metal layer getting wet with the solder layer when the solder layer melts.

5. The electronic device according to claim 1, wherein the wiring layer and the substrate are in contact with each other.

6. The electronic device according to claim 1, further comprising an adhesive material attaching the wiring layer and the substrate in contact.

7. The electronic device according to claim 1, wherein an upper surface of the projecting terminal positons above an upper surface of the wiring layer.

8. The electronic device according to claim 1, further comprising:
   other conductive layers arranged vertically and horizontally in a matrix state in a plan view in the resin layer along with the conductive layer.

* * * * *